United States Patent
Kang et al.

(10) Patent No.: US 12,176,447 B2
(45) Date of Patent: Dec. 24, 2024

(54) SOLAR CELL PANEL AND METHOD FOR MANUFACTURING SAME

(71) Applicant: SHANGRAO XINYUAN YUEDONG TECHNOLOGY DEVELOPMENT CO. LTD, Jiangxi Province (CN)

(72) Inventors: Woojoong Kang, Seoul (KR); Jinyoung Cho, Seoul (KR); Minseok Choi, Seoul (KR); Jaesung Kim, Seoul (KR)

(73) Assignee: Shangrao Xinyuan YueDong Technology Development Co. Ltd, Shangrao (CN)

( * ) Notice: Subject to any disclaimer, the term of this patent is extended or adjusted under 35 U.S.C. 154(b) by 3 days.

(21) Appl. No.: 17/922,241

(22) PCT Filed: Nov. 27, 2020

(86) PCT No.: PCT/KR2020/017185
§ 371 (c)(1),
(2) Date: Oct. 28, 2022

(87) PCT Pub. No.: WO2021/221260
PCT Pub. Date: Nov. 4, 2021

(65) Prior Publication Data
US 2023/0178670 A1 Jun. 8, 2023

(30) Foreign Application Priority Data

Apr. 29, 2020 (KR) .................. 10-2020-0052658

(51) Int. Cl.
*H01L 31/05* (2014.01)
*H01L 31/18* (2006.01)

(52) U.S. Cl.
CPC ........ *H01L 31/0508* (2013.01); *H01L 31/186* (2013.01); *H01L 31/0512* (2013.01)

(58) Field of Classification Search
None
See application file for complete search history.

(56) References Cited

U.S. PATENT DOCUMENTS

| | | |
|---|---|---|
| 2008/0216887 A1 | 9/2008 | Hacke et al. |
| 2011/0132425 A1 | 6/2011 | Kang |

(Continued)

FOREIGN PATENT DOCUMENTS

| | | | | |
|---|---|---|---|---|
| DE | 102013219526 A1 | 4/2015 | | |
| EP | 2911207 A1 * | 8/2015 | ......... | H01L 31/0201 |

(Continued)

OTHER PUBLICATIONS

English language machine translation of KR-20170032670-A. (Year: 2023).*

(Continued)

*Primary Examiner* — Eli S Mekhlin
(74) *Attorney, Agent, or Firm* — Tucker Ellis LLP

(57) ABSTRACT

According to a solar cell panel according to the present embodiment, a connection structure of a wiring unit for connecting a plurality of solar cells comprising first and second solar electrically connected to each other is improved. More particularly, the wiring unit comprises a first extension wiring and a second extension wiring, which correspond to each of the plurality of solar cells, the first extension wiring having a first outer portion extending outwards beyond a first side of a solar cell and a second extension wiring having a second outer portion extending outwards beyond a second side of the solar cell, the second side being opposite to the first side of the solar cell. A second extension wiring of the first solar cell and a first extension wiring of the second solar cell overlap each other to have a connection portion where they are connected to each other, and the connection portion includes an overlapping portion (Continued)

formed by the connection portion overlapping a portion of the first solar cell.

16 Claims, 12 Drawing Sheets

(56) References Cited

U.S. PATENT DOCUMENTS

| | | | |
|---|---|---|---|
| 2011/0155203 A1* | 6/2011 | Funakoshi | H01L 31/048 |
| | | | 136/244 |
| 2011/0290298 A1 | 12/2011 | Krause et al. | |
| 2016/0380120 A1 | 10/2016 | Terao | |
| 2017/0170349 A1* | 6/2017 | Magnusdottir | H01L 31/0201 |
| 2018/0053876 A1 | 2/2018 | Iida | |
| 2018/0342639 A1 | 11/2018 | Kwon | |
| 2019/0058072 A1 | 2/2019 | Hyun et al. | |

FOREIGN PATENT DOCUMENTS

| | | | | |
|---|---|---|---|---|
| EP | 3016147 A1 | | 5/2016 | |
| EP | 3242334 A1 * | | 11/2017 | H01L 27/142 |
| JP | 2014179406 A | | 9/2014 | |
| JP | 2016005002 A | | 1/2016 | |
| JP | 2017528919 A | | 9/2017 | |
| KR | 20170032670 A * | | 3/2017 | H01L 31/0201 |
| KR | 2018-0105838 | | 10/2018 | |
| WO | 2009019929 A1 | | 2/2009 | |
| WO | WO-2016190602 A1 * | | 12/2016 | H01L 31/02 |

OTHER PUBLICATIONS

English language machine translation of WO-2016190602-A1. (Year: 2023).*
Japanese Office Action from corresponding Japanese Application No. 2022-565704, mailed on Oct. 2, 2023, 10 pages with translation.
Australian Office Action from corresponding Australian Application No. 2020445474, mailed on Dec. 12, 2023, 6 pages.
International Search Report for PCT App No. PCT/KR2020/017185, mailed Mar. 24, 2021 (5 pages).
Extended European Search Report from corresponding Application No. 20933519.9 mailed on May 7, 2024, 8 pages.

* cited by examiner

SOLAR CELL PANEL AND METHOD FOR MANUFACTURING SAME

TECHNICAL FIELD

The present disclosure relates to a solar cell panel and a method for manufacturing the same, and more particularly, to a solar cell panel with improved structure and process, and a method for manufacturing the same.

BACKGROUND ART

A solar cell is a device that converts solar energy into electrical energy. A solar cell panel may be manufactured by electrically connecting a plurality of solar cells to wirings using the wirings and performing a packaging process of protecting the solar cells. Various structures, such as a structure for electrically connecting a plurality of solar cells using wirings, may be applied.

As an example, as disclosed in Korean Patent Laid-Open Publication No. 10-2017-0017776, adjacent solar cells may be connected by using wirings extending long to span two solar cells. The solar cell panel needs to generate electricity for a long time in various environments, so long-term reliability is greatly required. When wirings connecting a plurality of solar cells are repeatedly expanded and contracted due to a change in temperature, etc., there may be problem in that the wirings are separated from portions with weak adhesion. Accordingly, the output of the solar cell panel may be reduced, the defect rate may be high, and the long-term reliability may not be excellent. This problem may be exacerbated as the wirings are formed to extend portion long across two solar cells, and may occur more significantly when the wirings are positioned on only one surface of the solar cell.

In consideration of this problem, when wirings are formed to correspond to each solar cell, a separate wiring (e.g., a bridge wiring that is positioned between two solar cells and positioned in a direction crossing wirings corresponding to each solar cell) for connecting wirings corresponding to two solar cells is required. Accordingly, the material costs increase and the manufacturing process are complicated. In addition, there is a problem in that connection characteristics of the wirings corresponding to each solar cell and the bridge wiring connecting the same are not good, or that the process needs to be performed under harsh conditions for stable connection thereof. Accordingly, the reliability and productivity of the solar cell panel may be reduced.

DISCLOSURE

Technical Problem

The present embodiment provides a solar cell panel capable of improving reliability and productivity, and a method for manufacturing the same.

More specifically, the present embodiment provides a solar cell panel capable of improving connection characteristics while simplifying a connection structure and process of wirings connected to adjacent solar cells, and a method for manufacturing the same.

In particular, the present embodiment provides a solar cell panel capable of improving connection characteristics while simplifying a structure and process by not including a wiring intersecting a wiring between adjacent solar cells in a structure in which wirings corresponding to each solar cell are positioned on one side, and a method for manufacturing the same.

Technical Solution

According to a solar cell panel according to the present embodiment, a connection structure of a wiring unit for connecting a plurality of solar cells comprising first and second solar electrically connected to each other is improved. More particularly, the wiring unit comprises a first extension wiring and a second extension wiring, which correspond to each of the plurality of solar cells, the first extension wiring having a first outer portion extending outwards beyond a first side of a solar cell and a second extension wiring having a second outer portion extending outwards beyond a second side of the solar cell, the second side being opposite to the first side of the solar cell. The second extension wiring of the first solar cell and the first extension wiring of the second solar cell overlap each other to have a connection portion where they are connected to each other, and the connection portion includes an overlapping portion formed by the connection portion overlapping a portion of the first solar cell.

The second extension wiring of the first solar cell and the first extension wiring of the second solar cell may extend in parallel to each other and may be directly connected to each other. The second extension wiring of the first solar cell may be positioned to be spaced apart from the second solar cell. In this case, the first extension wiring of the second solar cell may be positioned on the second extension wiring of the first solar cell in the connection portion.

For example, a length of the first outer portion may be greater than a width of the first or second extension wiring; or a length of the second outer portion may be greater than the width of the first or second extension wiring; or a length of the connection portion may be greater than the width of the first or second extension wiring; or a length of the second outer portion may be equal to or greater than a separation distance between an outer end portion of the second outer portion and the second solar cell; or a length of the overlapping portion may be greater than the width of the first or second extension wiring; or the length of the overlapping portion may be longer than that of the second outer portion; or the length of the overlapping portion may be equal to or greater than an end distance between an inner end portion of the first or second extension wiring and the second side or the first side of the solar cell.

For example, the overlapping portion may be positioned to overlap at least one of the first and second electrodes provided in the first solar cell.

In the present embodiment, the solar cell panel may include a fixing portion formed to include at least a portion of the connection portion to fix the first extension wiring and the second extension wiring. For example, the connection portion may include an inter-cell portion positioned in an inter-cell region between the first solar cell and the second solar cell, and the fixing portion may be partially formed corresponding to the inter-cell part and may be formed of a pre-joint portion having a thickness, surface roughness, or shape different from the other portion. As another example, the fixing portion may include a fixing member that covers at least a portion of the connection portion. In this case, the fixing member may be formed of an insulating tape that is formed to cover at least the first solar cell and at least a portion of the overlapping portion.

In the present embodiment, an area of the connection portion may be 3 to 16.5 mm².

In the present embodiment, yield strength of the first extension wiring or the second extension wiring may be 80 to 170 MPa.

In the present embodiment, the plurality of solar cells may constitute a plurality of solar cell strings in a second direction intersecting the first direction, and may further include a bus bar wiring connecting the plurality of solar cell strings in the second direction from the end portion, and the first extension wiring or the second extension wiring may have a different material, a different melting point, or different yield strength from the bus bar wiring.

For example, a melting point of the first extension wiring or the second extension wiring may be higher than that of the bus bar wiring; or the first extension wiring or the second extension wiring may contain a tin-bismuth alloy and the bus ribbon contains a tin-lead alloy; or yield strength of the first extension wiring or the second extension wiring may be equal to or lower than that of the bus bar wiring.

According to the present embodiment, a solar cell panel includes: a solar cell; a first extension wiring including a first outer portion extending outwards beyond the first side of the solar cell in a first direction; and a second extension wiring having a second outer portion extending outwards beyond a second side opposite to the first side of the solar cell in the first direction, in which the first outer portion and the second outer portion may have different lengths.

For example, a length of the first outer portion may be greater than a width of the first or second extension wiring; or a length of the second outer portion may be greater than the width of the first or second extension wiring; or the length of the second outer portion may be equal to or greater than an end distance between an inner end portion of the first or second extension wiring and the second side or the first side of the solar cell; or an inner end portion of the first extension wiring and an inner end portion of the second extension wiring may be symmetrically positioned to each other in the first direction.

According to the present embodiment, a method for manufacturing a solar cell panel includes: manufacturing a plurality of solar cells including first and second solar cells electrically connected to each other; preparing a wiring material including a process of increasing yield strength; attaching a first extension wiring and a second extension wiring to each of the plurality of solar cells; putting the first solar cell as it is, rotating and putting the second solar cell by 180°, and arranging the first extension wiring of the second solar cell on the second extension wiring of the first solar cell so that the first extension wiring of the second solar cell overlap a portion of the first solar cell; forming a fixing portion in at least a portion of a connection area where the first extension wiring and the second extension wiring overlap and are connected to constitute a solar cell string; and laminating a first cover member, a first encapsulant, the solar cell string, a second encapsulant, and a second cover member and applying heat and pressure to the laminated first cover member, first encapsulant, solar cell string, second encapsulant, and second cover member to integrate the stacked first cover member, first encapsulant, solar cell string, second encapsulant, and second cover member.

For example, the connection portion may include an inter-cell portion positioned in an inter-cell region between the first solar cell and the second solar cell, and in the forming of the fixing portion, the fixing portion formed of a pre joint portion may be formed by partially soldering the inter-cell portion. As another example, in the forming of the fixing portion, the fixing member formed of an insulating tape may be attached on at least the first solar cell and at least a portion of the overlapping portion.

In the process of increasing yield strength, the first and second extension wirings may have yield strength of 80 to 170 MPa by stretching a base wiring having yield strength of 50 to 120 MPa in a process of unwinding the base wiring.

Advantageous Effects

According to the present embodiment, it is possible to improve connection characteristics and improve structural stability by providing first and second extension wirings corresponding to each solar cell and having different lengths to sufficiently secure an area (particularly, overlapping portion) of a connection portion. In this case, since the first and second extension wirings extend portion parallel to each other and are directly connected to each other, it is possible to reduce material costs and simplify a process by having a simple structure that does not include wirings intersecting the first and second extension wirings. Accordingly, it is possible to improve reliability and productivity of the solar cell panel.

In addition, it is possible to manufacture a solar cell panel having a desired arrangement and structure of solar cells and wiring units with a simple process by forming a plurality of solar cells, putting some of the solar cells as they are, and rotating and putting others of the solar cells. In addition, since the first and second extension wirings extending in parallel are connected to each other to have an overlapping portion to form only a fixing portion for preliminary fixing before a lamination process, a process may be further simplified. In addition, the first and second extension wirings can have desired characteristics by performing a yield strength increasing process in a wiring material preparing step. Accordingly, it is possible to improve productivity of a solar cell panel having excellent reliability.

DESCRIPTION OF DRAWINGS

FIG. 5 is a partial plan view illustrating enlarged portion A of FIG. 4, in which FIG. 5A is a front plan view and FIG. 5B is a rear plan view.

MODE FOR DISCLOSURE

Figure 1:
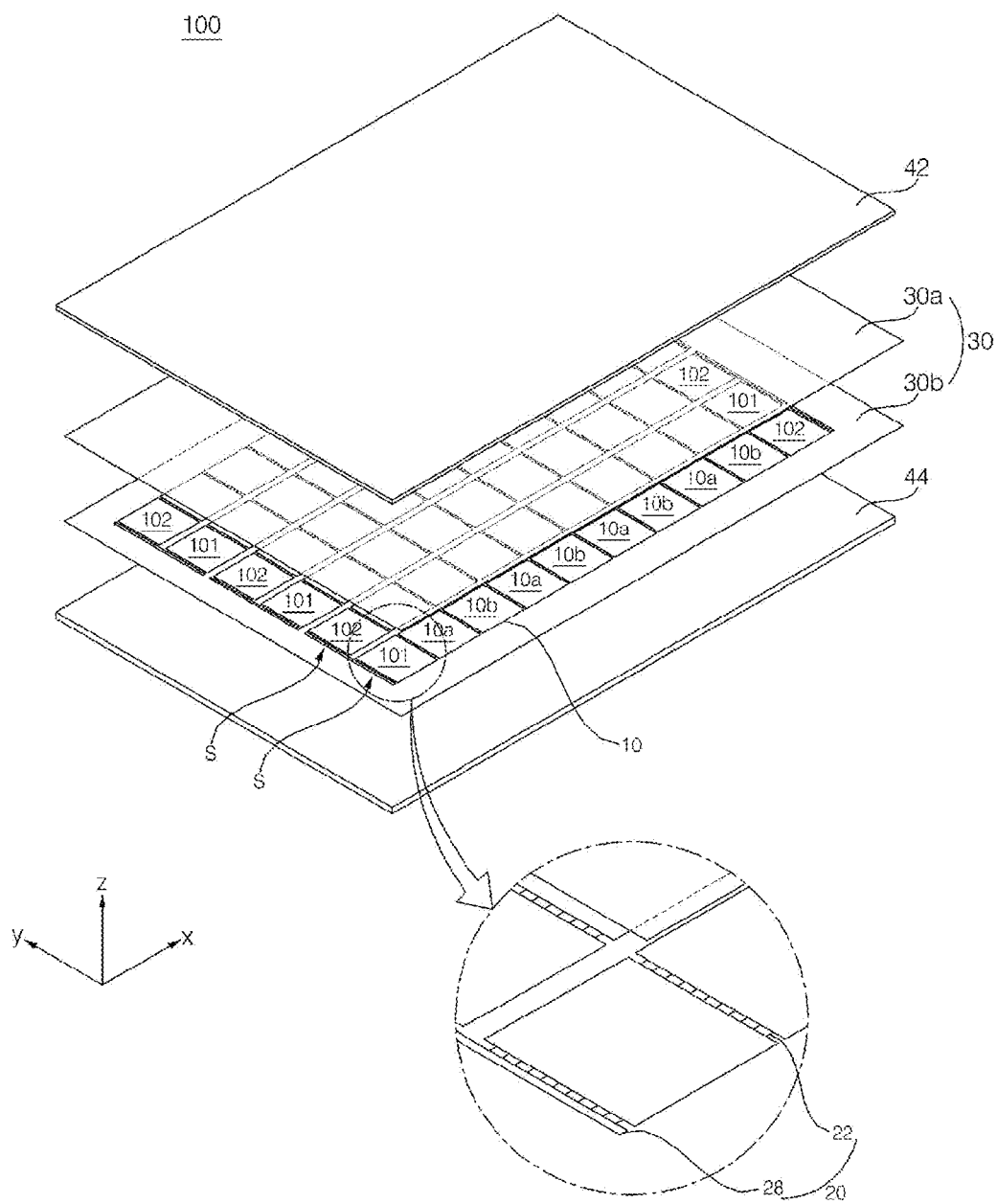
FIG. 1 is an exploded perspective view schematically illustrating a solar cell panel according to an embodiment of the present disclosure.

Hereinafter, exemplary embodiments in the present disclosure will be described in detail with reference to the accompanying drawings. However, it goes without saying that the present disclosure is not limited to these embodiments and may be modified in various forms.

In the drawings, in order to clearly and briefly describe the present disclosure, the illustration of parts irrelevant to the description is omitted, and the same reference numerals are used for the same or extremely similar parts throughout the specification. In addition, in the drawings, a thickness, a width, etc., are enlarged or reduced in order to make the description more clear, and the thickness, the width, or the like of the present disclosure are not limited to those illustrated in the drawings.

When a certain part "includes" another part throughout the specification, other portions are not excluded unless otherwise stated, and other portions may be further included. In addition, when parts such as a layer, a film, a region, or a plate is referred to as being "on" another part, it may be "directly on" another part or may have another part present therebetween. In addition, when a portion of a layer, film, region, plate, etc., is "directly on" another part, it means that no other part is positioned therebetween.

Hereinafter, a solar cell panel and a method for manufacturing the same according to an embodiment of the present disclosure will be described in detail with reference to the accompanying drawings. In the present specification, expressions such as "first" and "second" are used to distinguish each other, and the present disclosure is not limited thereto.

Figure 2:
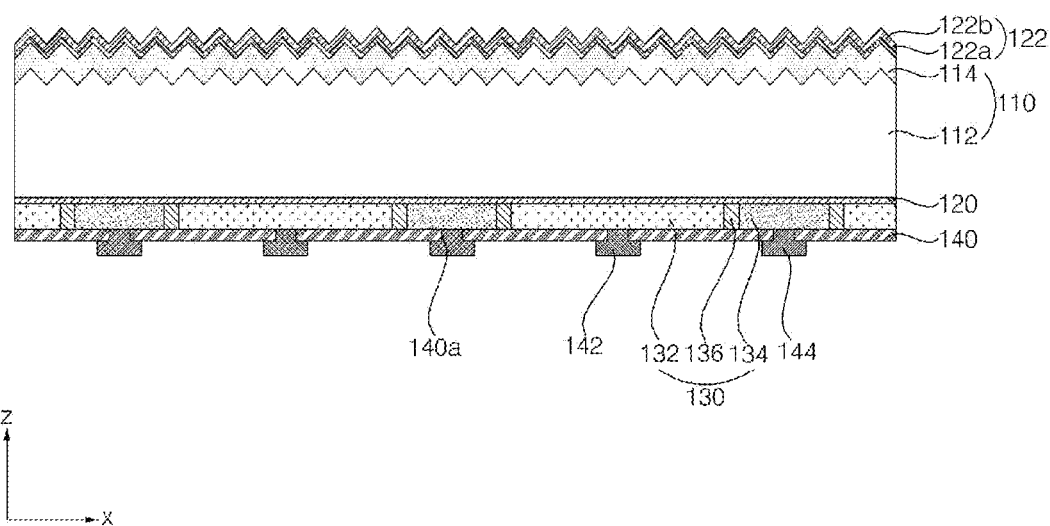
FIG. 2 is a cross-sectional view illustrating an example of a solar cell included in the solar cell panel illustrated in FIG. 1.

FIG. 1 is an exploded perspective view schematically illustrating a solar cell panel according to an embodiment of the present disclosure and FIG. 2 is a cross-sectional view illustrating an example of a solar cell included in the solar cell panel illustrated in FIG. 1. For reference, FIG. 2 is a cross-sectional view of a solar cell taken along line II-II of FIG. 3.

Referring to FIGS. 1 and 2, a solar cell panel 100 according to the present embodiment includes a plurality of solar cells 10 including first and second solar cells 10a and 10b connected to each other and a wiring unit 20 electrically connecting the plurality of solar cells 10. In addition, the solar cell panel 100 includes an encapsulant 30 that surrounds and seals the solar cell 10 and the wiring unit 20, a first cover member 42 that is positioned on one surface (e.g., front surface) of the solar cell 10 on the encapsulant 30, and a second cover member 44 that is positioned on the other surface (e.g., rear surface) of the solar cell 10 on the encapsulant 30. This will be described in more detail. In this case, the solar cell 10 may include a semiconductor substrate 110 and first and second electrodes 142 and 144 positioned on one surface (e.g., rear surface) of the semiconductor substrate 110.

In the present embodiment, the solar cell panel 100 includes the plurality of solar cells 10, and the plurality of solar cells 10 may be electrically connected to each other in series, parallel, or series-parallel by the wiring unit 20.

For example, the wiring unit 20 may include a wiring material 22 whose at least a part overlaps first and second electrodes 142 and 144 of each solar cell 10 to be connected to the first and second electrodes 142 and 144. The plurality of solar cells 10 may be connected in a first direction (x-axis direction in the drawing) by the wiring material 22 to form one column (i.e., solar cell string S). In addition, the wiring unit 20 may include bus bar wirings 28 that are positioned at both ends of the solar cell string S and connects the solar cell string S to another solar cell string S or an external circuit (e.g., junction box) (not illustrated).

The encapsulant 30 may include a first encapsulant 30a that is positioned on the front surface of the solar cell 10 connected by the wiring unit 20 and a second encapsulant 30b that is positioned at the rear face of the solar cell 10. The first encapsulant 30a and the second encapsulant 30b prevent moisture and oxygen from being introduced and chemically bond each element of the solar cell panel 100. The first and second encapsulants 30a and 30b may be made of an insulating material having light-transmitting properties and adhesive properties. For example, an ethylene vinyl acetate copolymer resin (EVA), polyvinyl butyral, a silicon resin, an ester-based resin, an olefin-based resin, etc., may be used as the first encapsulant 30a and the second encapsulant 30b. The second cover member 44, the second encapsulant 30b, the solar cell 10, the wiring unit 20, and the first encapsulant 30a, and the first cover member 42 may be integrated by a lamination process or the like using the first and second encapsulants 30a and 30b, so the solar cell panel 100 may be constituted. Although the first and second encapsulants 30a and 30b are separately illustrated in FIG. 1, the first and second encapsulants 30a and 30b are integrated by the lamination process to be constituted as an integrated portion that does not have a separate boundary.

The first cover member 42 is positioned on the first encapsulant 30a to form one surface (e.g., front surface) of the solar cell panel 100, and the second cover member 44 is positioned on the second encapsulant 30b to form the other surface (e.g., rear surface) of the solar cell 10. Each of the first cover member 42 and the second cover member 44 may be made of an insulating material capable of protecting the solar cell 10 from external impact, moisture, ultraviolet rays, and the like. In addition, the first cover member 42 is made of a light-transmitting material that may transmit light, and the second cover member 44 may be formed of a sheet made of a light-transmitting material, a non-light transmitting material, a reflective material, or the like. For example, the first cover member 42 may be formed of a glass substrate or the like, and the second cover member 44 may be formed of a film, a sheet, or the like. The second cover member 44 has a Tedlar/PET/Tedlar (TPT) type, or may include a poly vinylidene fluoride (PVDF) resin layer formed on at least one surface of a base film (e.g., polyethylene terephthalate (PET)).

However, the present disclosure is not limited thereto. Accordingly, the first and second encapsulants 30a and 30b, the first cover member 42, or the second cover member 44 may include various materials other than those described above and may have various shapes. For example, the first cover member 42 or the second cover member 44 may have various shapes (e.g., a substrate, a film, a sheet, etc.) or materials.

An example of the solar cell 10 included in the solar cell panel 100 according to the embodiment of the present disclosure will be described in more detail with reference to FIG. 2.

Referring to FIG. 2, the solar cell 10 according to the present embodiment includes a photoelectric conversion unit including a semiconductor substrate 110, and the first and second electrodes 142 and 144 connected to the photoelectric conversion unit. Here, the first and second electrodes 142 and 144 may include portions formed parallel to each other. In the present embodiment, the first electrode 142 and the second electrode 144 that collect carriers having opposite polarities to each other may be formed parallel to each other while being positioned together on one surface (e.g., rear surface) of the photoelectric conversion unit. As such, the solar cell 10 may have a rear electrode structure.

In the present embodiment, the photoelectric conversion unit may include the semiconductor substrate 110 and conductive regions 132 and 134 positioned on the semiconductor substrate 110 or over the semiconductor substrate 110. In the present embodiment, the first conductive region 132 and the second conductive region 134 participating in carriers having opposite polarities to each other may be positioned together on one surface (e.g., rear surface) of the semiconductor substrate 110. In this case, it is exemplified that the first and second conductive regions 132 and 134 are positioned separately from the semiconductor substrate 110 with an intermediate layer 120 interposed therebetween.

For example, the semiconductor substrate 110 may include a base region 112 made of a crystalline semiconductor (e.g., single crystal or polycrystalline semiconductor, for example, a single crystal or polycrystalline silicon wafer, particularly single crystal silicon) including a second conductive type dopant. As described above, the solar cell 10 based on the base region 112 or the semiconductor substrate 110 having few defects due to high crystallinity has excellent electrical characteristics. A front electric field region 114 having the same conductivity type as the base region 112 and a higher doping concentration than the base region 112 may be positioned on the front surface of the semiconductor substrate 110. In addition, an anti-reflection structure (e.g., a pyramid-shaped texturing structure formed of a (111) surface of the semiconductor substrate 110) for preventing reflection may be provided on the front surface of the semiconductor substrate 110, and the rear surface of the semiconductor substrate 110 may be formed of a mirror-polished surface and may have a smaller surface roughness than the front surface. However, the present disclosure is not limited thereto, but may be variously modified.

The intermediate layer 120 may be formed of an oxide film, a dielectric film or insulating film containing silicon, a nitride oxide film, a carbide oxide film, or the like. For example, the intermediate layer 120 may be a silicon oxide film. The intermediate layer 120 may function as a doping barrier layer preventing diffusion of the first or second conductive dopant included in the first and second conductive regions 132 and 134, a tunneling layer in which tunneling of a majority carrier occurs, or the like.

The first and second conductive regions 132 and 134 may be formed by being doped with the first or second conductive dopant, such as an amorphous semiconductor, a microcrystalline semiconductor, or a polycrystalline semiconductor (e.g., amorphous silicon, microcrystalline silicon, or polycrystalline silicon). In particular, when the first and second conductive regions 132 and 134 have polycrystalline semiconductor, the first and second conductive regions 132 and 134 may have high carrier mobility. For example, when the first or second conductive dopant is a p type, a group III element such as boron (B), aluminum (Al), gallium (Ga), or indium (In) may be used. When the first or second conductive dopant is an n type, a group V element such as phosphorus (P), arsenic (As), bismuth (Bi), or antimony (Sb) may be used. For example, one of the first and second conductive dopants may be boron (B) and the other may be phosphorus (P).

The first conductive region 132 may include the plurality of first conductive regions 132 extending long in a second direction (e.g., y-axis direction in the drawing) intersecting (e.g., orthogonal) to the first direction. In addition, the second conductive region 134 may include the plurality of second conductive regions 134 extending long in the second direction. In this case, the first conductive region 132 and the second conductive region 134 may be alternately positioned in the first direction, and a barrier region 136 may be formed between the first conductive region 132 and the second conductive region 134.

In this case, an area (e.g., width) of the first conductive region 132 may be greater than that (e.g., width) of the second conductive region 134. As a result, the first conductive region 132 functioning as an emitter region may have a wider area than the second conductive region 134 functioning as the rear surface electric field region, and thus, may be advantageous for photoelectric conversion. In the present embodiment, the first and second conductive regions 132 and 134 may be positioned together in the semiconductor layer 130 positioned on the same plane, and the barrier region 136 made of an undoped intrinsic semiconductor may be provided between the first and second conductive regions 132 and 134.

However, the present disclosure is not limited thereto. For example, the intermediate layer 120 may not be provided. Alternatively, the positions, shapes, and the like of the first and second conductive regions 132 and 134 and/or the barrier region 136 may be variously modified. Alternatively, at least one of the first and second conductive regions 132 and 134 may be formed by doping a portion of the semiconductor substrate 110 with a dopant to be formed as a doped region constituting a portion of the semiconductor substrate 110. In addition, the barrier region 136 may not be provided, or the barrier region 136 may be made of a material other than a semiconductor material or may be formed of an empty space. Various other modifications are possible.

In addition, the front insulating layer 122 may be positioned on the front surface of the semiconductor substrate 110 (more precisely, on the front electric field region 114 formed on the front surface of the semiconductor substrate 110) as a whole. The front insulating layer 122 may include at least one of a front passivation layer 122a and an anti-reflection layer 122b. The rear passivation layer 140 may be positioned on the rear surface of the semiconductor layer 130 as a whole, except for a contact hole 140a. For example, the front passivation layer 122a, the anti-reflection layer 122b, or the rear passivation layer 140 may have a single layer or multiplayer structure, in which two or more layers are combined, selected from the group consisting of a silicon nitride film, a silicon nitride film containing hydrogen, a silicon oxide film, a silicon oxynitride film, an aluminum oxide film, a silicon carbide film, $MgF_2$, ZnS, $TiO_2$, and $CeO_2$.

The first electrode 142 may be electrically connected (e.g., in contact with) to the first conductive region 132 through the 140a, and the second electrode 144 may be electrically connected (e.g., in contact with) to the second conductive region 134 through the 140a. The first electrode 142 and the second electrode 144 may be made of a conductive material (e.g., metal). The shapes, positions, number, etc., of the contact holes 140a may be variously modified.

The solar cell 10 is electrically connected to another solar cell 10 by the wiring unit 20 including the wiring material 22. Hereinafter, the structures of the solar cell 10 and the wiring unit 20 according to the present embodiment will be described in more detail with reference to FIGS. 3A, 3B, and 4 to 6.

Figure 3A:
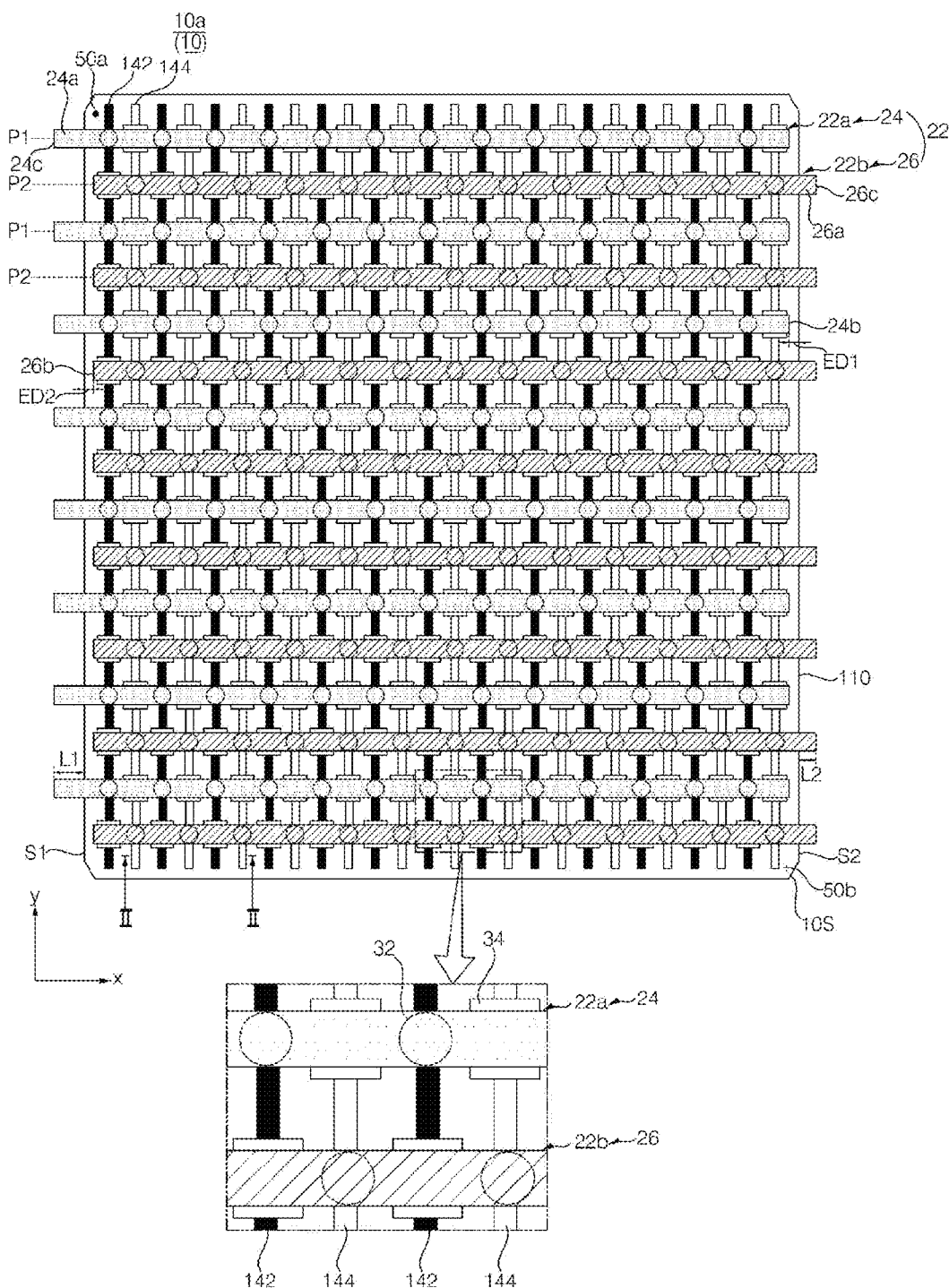
FIG. 3A is a rear plan view illustrating a first solar cell, a wiring material, an insulating member, and a connection member included in the solar cell panel illustrated in FIG. 1.
Figure 3B:
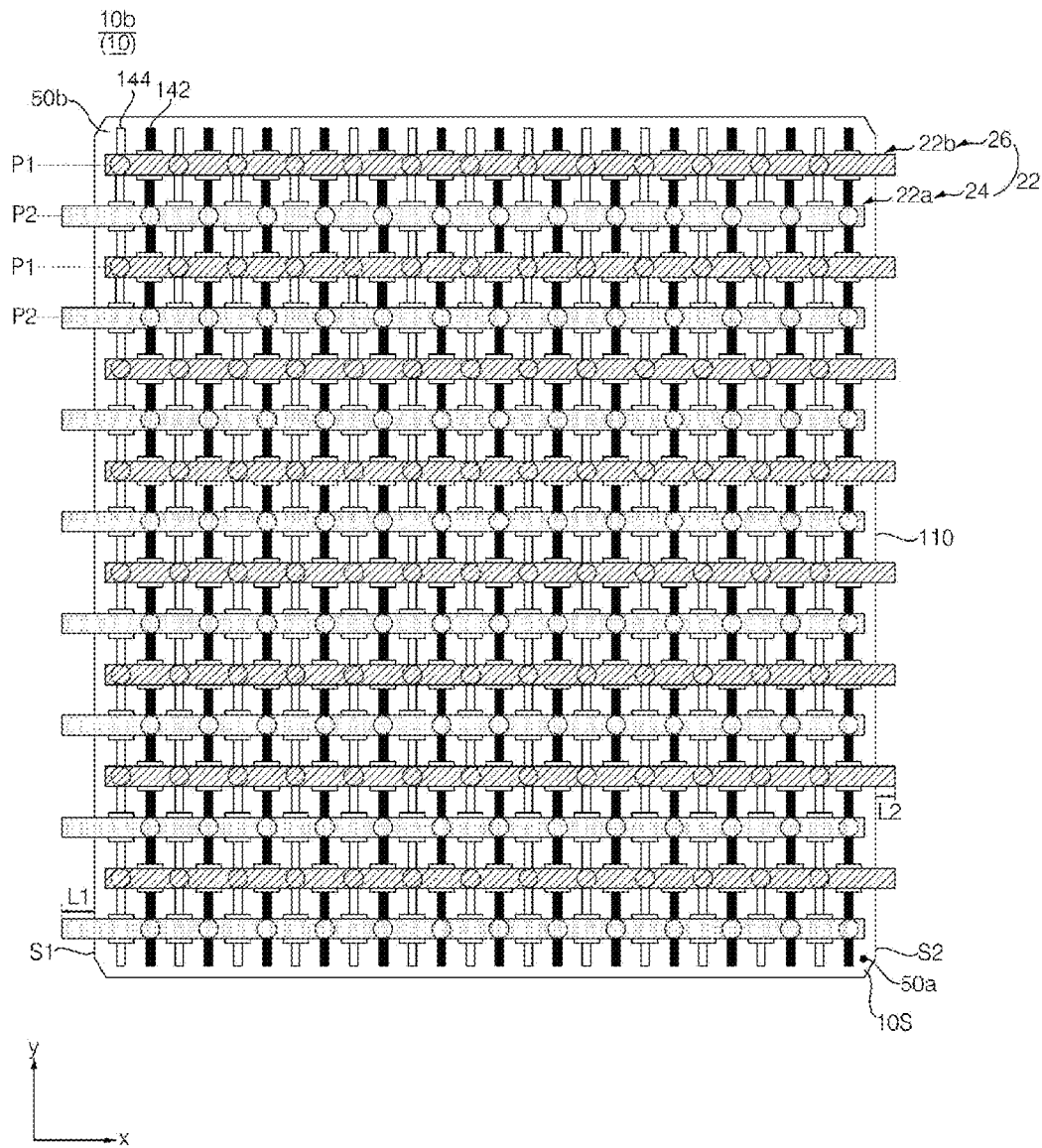
FIG. 3B is a rear plan view illustrating a second solar cell, a wiring material, an insulating member, and a connection member included in the solar cell panel illustrated in FIG. 1.

FIG. 3A is a rear plan view illustrating the first solar cell 10a, the wiring material 22, the insulating member 34, and the connection member 32 included in the solar cell panel 100 illustrated in FIG. 1, and FIG. 3B is a rear plan view illustrating the second solar cell 10b, the wiring material 22, the insulating member 34, and the connection member 32 included in the solar cell panel 100 illustrated in FIG. 1.

In the present embodiment, the solar cell string S is configured to include the first and second solar cells 10a and 10b and the first and second solar cells 10a and 10b having a difference in arrangement of the first and second wirings 22a and 22b connected to the first and second electrodes 142 and 144, and the connection structures of the first and second electrodes 142 and 144 and the first and second wirings 22a and 22b are the same as each other in the first and second solar cells 10a and 10b. Accordingly, after first describing the connection structures of the first and second electrodes 142 and 144 and the first and second wirings 22a and 22b in the solar cell 10, the difference between the first and second solar cells 10a and 10b will be described in detail.

Referring to FIGS. 3A and 3B together with FIGS. 1 and 2, in each solar cell 10, the first and second electrodes 142 and 144 may have a shape corresponding to the first and second conductive regions 132 and 134, respectively. Accordingly, the plurality of first electrodes 142 extending long in the second direction may be provided so that the first electrodes 142 correspond to the plurality of first conductive regions 132. The plurality of second electrodes 144 extending long in the second direction may be provided so that the second electrodes 144 correspond to the plurality of second conductive regions 134. In addition, the first electrode 142 and the second electrode 144 may be alternately positioned to correspond to the first conductive region 132 and the second conductive region 134 in the first direction. In this case, the first and second electrodes 142 and 144 may have a smaller width while having the same or similar shape as the corresponding first and second conductive regions 132 and 134. However, the present disclosure is not limited thereto, and the first and second electrodes 142 and 144 may have shapes different from those of the first and second conductive regions 132 and 134.

In the present embodiment, the wiring material 22 may include a first wiring 22a connected to the first electrode 142 in each of the solar cells 10 and a second wiring 22b connected to the second electrode 144. More specifically, in each solar cell 10, the first wiring 22a may extend long in the first direction so that the first wiring 22a is connected to the plurality of first electrodes 142 by overlapping the plurality of first electrodes 142. Similarly, in each solar cell 10, the second wiring 22b may extend long in the first direction so that the second wiring 22b is connected to the plurality of second electrodes 144 by overlapping the plurality of second electrodes 144. In this case, in each solar cell 10, the first wiring 22a may be electrically connected to the first electrode 142 provided in each solar cell 10 through the connection member 32 and insulated from the second electrode 144 by the insulating member 34. In each solar cell 10, the second wiring 22b may be electrically connected to the second electrode 144 through the connection member 32, and insulated from the first electrode 142 by the insulating member 34. For example, the connection member 32 positioned between the first wiring 22a and the first electrode 142 may be in contact with the first wiring 22a and the first electrode 142, respectively, and the connection member 32 positioned between the second wiring 22b and the second electrode 144 may be in contact with the second wiring 22b and the second electrode 144, respectively. When viewed from the second direction in each solar cell 10, the plurality of first wirings 22a and the plurality of second wirings 22b may be alternately positioned to each other. Then, the plurality of first and second wirings 22a and 22b may be connected to the plurality of first and second electrodes 142 and 144 while having uniform distance to effectively transfer carriers.

In the present embodiment, the connection member 32 may contain various conductive materials, and the insulating member 34 may contain various insulating materials. For example, the connection member 32 may be made of a material containing a material included in the first and second electrodes 142 and 144 and/or the wiring material 22 or a mixture thereof. For example, the connection member 32 may contain the first and second electrodes 142 and 144 and/or the wiring material 22 by a process of putting the wiring material 22 on the first or second electrodes 142 and 144 and applying heat to the first and second electrodes 142 and 144, or the like. Alternatively, the connection member 32 may include a solder paste layer, an epoxy solder paste layer, or the like. For example, the connection member 32 may include a low-temperature solder paste layer and a high-temperature solder paste layer together. The insulating member 34 may include a silicone-based resin, an epoxy-based resin, a urethane-based resin, an acrylic resin, polyimide, polyethylene, or the like. However, the present embodiment is not limited to the materials of the connection member 32 and the insulating member 34, and the connection member 32 and the insulating member 34 may be made of various materials.

In the present embodiment, the first and second wirings 22a and 22b are each positioned to correspond to the solar cell 10. Here, the fact that the first wirings 22a correspond to the solar cells 10 may mean that the first wirings 22a connected to the plurality of first electrodes 142 formed in each solar cell 10 in the first direction by the connection members 32 are individually positioned in each solar cell 10 but may be provided singly. The fact that the second wirings 22b each correspond to the solar cells 10 may mean that the second wirings 22b connected to the plurality of second electrodes 144 formed in each solar cell 10 in the first direction by the connection members 32 are individually positioned in each solar cell 10 but may be provided singly. Accordingly, the first wirings 22a are not connected to the first electrodes 142 provided in the plurality of solar cells 10 together through the connection members 32, but the plurality of first wirings 22a are not provided in one solar cell 10 in the first direction. Accordingly, the first wirings 22a are not connected to the first electrodes 142 provided in the plurality of solar cells 10 together through the connection members 32, but the plurality of first wirings 22a are not provided in one solar cell 10 in the first direction. Accordingly, the first wiring 22a or the second wiring 22b may have a length similar to or slightly greater than that of the solar cell 10 in the first direction. For example, the total length of the first wiring 22a or the second wiring 22b in the first direction may be within 120% (e.g., 110%) of lengths (e.g., maximum length) of each solar cell 10. As described above, since the first wiring 22a and the second wiring 22b are not formed across the two solar cells 10 as a whole, the lengths of the first wiring 22a and the second wiring 22a and 22b may be reduced, and the structure may be simplified by being formed as a single unit to individually correspond to each solar cell 10. Accordingly, a problem that may occur when the total length of the first wiring 22a or the second wiring 22b is large may be effectively prevented.

More specifically, when the temperature is changed in the environment in which the solar cell panel 100 is positioned, the expansion and contraction of the first or second wirings 22a and 22b are repeated. In this case, problems such as the wiring material 22 being separated from the solar cell 10 or the wiring material 22 being damaged or torn may occur due to the expansion and contraction of the first or second wirings 22a and 22b. This problem may appear more serious as the total length of the first or second wirings 22a and 22b increases. When such a problem occurs, the solar cell panel 100 may be determined to be defective, and an output may be reduced. In particular, as in the present embodiment, in the structure in which the first and second electrodes 142 and 144 and the wiring material 22 are positioned only on one surface of the solar cell 10, the problems due to the expansion and contraction of the first or second wirings 22a and 22b may appear more serious.

In consideration of this, in the present embodiment, the problems due to the expansion and contraction of the wiring material 22 may be prevented by using the first or second wirings 22a and 22b having a relatively short overall length. Accordingly, it is possible to prevent the decrease in output and defects of the solar cell panel 100 and improve the long-term reliability of the solar cell panel 100.

In addition, since the first wiring 22a and the second wiring 22b are individually formed corresponding to each solar cell 10, after the first wiring 22a and the second wiring 22b are attached to each solar cell 10, by connecting or preliminarily fixing the first wiring 22a and the second wiring 22b of the adjacent solar cells 10 (e.g., the first solar cell 10a and the second solar cell 10b), the adjacent solar cells 10 may be electrically and/or physically connected to each other. Accordingly, it is possible to simplify an alignment process of the solar cell 10 and the wiring material 22. In addition, when repair, replacement, or the like is required due to damage to the wiring material 22, the solar cell 10, or the like, only the wiring material 22 or the solar cell 10 may be replaced, which facilitates repair and replacement. On the other hand, when a single wiring material extending across two adjacent solar cells is used, since it is necessary to align two adjacent solar cells and a single wiring material across the solar cells together, the alignment process becomes complicated and misalignment is highly likely to occur. In addition, when there is damage to the solar cell or wiring material, the problems may occur that it is difficult to repair or replace the solar cell or the wiring material since a process such as cutting the wiring material for the repair or replacement of the solar cell or the wiring material is performed, the reliability is greatly reduced in the reconnected area, and the like.

In the present embodiment, among the first wiring 22a and the second wiring 22b, a wiring having a first outer portion 24a extending outwards beyond a first side S1 (e.g., left side of FIGS. 3A and 3B) of the solar cell 10 may be referred to as a first extension wiring 24, and a wiring having a second outer portion 26a extending outwards beyond a second side S2 (e.g., right side of FIGS. 3A and 3B) opposite to the first side S1 may be referred to as a second extension wiring 26. In the present embodiment, a length L1 of the first extension portion 24a and a length L2 of the second extension portion 26a are different from each other in the first direction. The first extension portion 24a and the second extension portion 26b included in the two solar cells 10 adjacent to each other are portions extending to constitute at least a portion of the connection portion (reference numeral CP in FIG. 5, hereinafter the same) overlapping and connected to each other, and in the present embodiment, the length L1 of the first extension portion 24a and the length L2 of the second extension portion 26a are different from each other, so the connection characteristics of the first extension wiring 24 and the second extension wiring 26 (i.e., the first wiring 22a and the second wiring 22b) may be improved. This will be described in more detail later.

As described above, in the present embodiment, the first solar cell 10a and the second solar cell 10b in which the arrangements of the first and second electrodes 142 and 144 and/or the first and second wirings 22a and 22b are different from each other are provided together.

More specifically, as illustrated in FIG. 3A, in the first solar cell 10a, a pair having the arrangement of the first electrode 142 and the second electrode 144 may be repeatedly positioned from the first side S1 to the second side S2 in the first direction. Accordingly, in the first solar cell 10a, the arrangement of the first electrode 142 and the second electrode 144, the first electrode 142 and the second electrode 144, the first electrode 142 and the second electrode 144, and the like may be repeated from the first side S1 to the second side S2 in the first direction. As illustrated in FIG. 3B, in the second solar cell 10b, a pair having the arrangement of the second electrode 144 and the first electrode 142 may be repeatedly positioned from the first side S1 to the second side S2 in the first direction. Accordingly, in the second solar cell 10b, the arrangement of the second electrode 144 and the first electrode 142, the second electrode 144 and the first electrode 142, the second electrode 144 and the first electrode 142, and the like may be repeated from the first side S1 to the second side S2 in the first direction. That is, the arrangement order of the first electrode 142 and the second electrode 144 in the first and second solar cells 10a and 10b in the first direction is opposite to each other.

In each of the first and second solar cells 10a and 10b, the first wiring 22a may constitute the first extension wiring 24, and the second wiring 22b may constitute the second extension wiring 26. In this case, in the first and second solar cells 10a and 10b, different wirings are positioned at the same position as each other in the second direction.

That is, in the first and second solar cells 10a and 10b, the first wiring 22a and the second wiring 22b of the first solar cell 10a are positioned at the same position (e.g., the first position P1) in the first direction in the first direction. In the first and second solar cells 10a and 10b, the second wiring 22b of the first solar cell 10a and the first wiring 22b of the second solar cell 10b may be positioned in a position (e.g., second position P2) different from a first position P1 in the first direction. The first and second positions P1 and P2 may be alternately positioned in the second direction, and thus, the first wiring 22a and the second wiring 22b may be alternately positioned.

More specifically, a pair having the arrangement of the first wiring 22a and the second wiring 22b may be repeatedly positioned from one side (e.g., upper side in FIG. 3A) to a lower side (e.g., lower side in FIG. 3A) of the first solar cell 10a in the second direction. Accordingly, in the first solar cell 10a, the first wiring 22a and the second wiring 22b, the first wiring 22a and the second wiring 22b, the first wiring 22a and the second wiring 22b, and the like may be arranged from one side to the other side in the second direction. A pair having the arrangement of the second wiring 22b and the first wiring 22a may be repeatedly positioned from one side (e.g., upper side in FIG. 3B) to a lower side (e.g., lower side in FIG. 3B) of the second solar cell 10b in the second direction. Accordingly, in the second solar cell 10b, the second wiring 22b and the first wiring 22a, the second wiring 22b and the first wiring 22a, the second wiring 22b and the first wiring 22a, and the like may be arranged from one side to the other side in the second direction.

Accordingly, in the first and second solar cells 10a and 10b, the first extension wiring 24 of the first solar cell 10a and the second extension wiring 26 of the second solar cell 10b are positioned at the first position P1. In the first and second solar cells 10a and 10b, the second extension wiring 26 of the first solar cell 10a and the first extension wiring 24 of the second solar cell 10b are positioned at the second position P2. The first and second positions P1 and P2 may be alternately positioned in the second direction, and thus, the first extension wiring 24 and the second extension wiring 26 may be alternately positioned. More specifically, a pair having the arrangement of the first extension wiring 24 and the second extension wiring 26 may be repeatedly positioned from one side (e.g., upper side in FIG. 3A) to a lower side (e.g., lower side in FIG. 3A) of the first solar cell 10a in the second direction. Accordingly, in the first solar cell 10a, the first extension wiring 24 and the second extension wiring 26, the first extension wiring 24 and the second extension wiring 26, the first extension wiring 24 and the second extension wiring 26, and the like may be arranged from one side to the other side in the second direction. A pair having the arrangement of the second extension wiring 26 and the first extension wiring 24 may be repeatedly positioned from one side (e.g., upper side in FIG. 3B) to a lower side (e.g., lower side in FIG. 3B) of the second solar cell 10b in the second direction. Accordingly, in the second solar cell 10b, the second extension wiring 26 and the first extension wiring 24, the second extension wiring 26 and the first extension wiring 24, the second extension wiring 26 and the first extension wiring 24, and the like may be arranged from one side to the other side in the second direction.

That is, in the first and second solar cells 10a and 10b, the arrangement order of the first wiring 22a and the second wiring 22b in the second direction, and the arrangement order of the first extension wiring 24 and the second extension wiring 26 are opposite to each other.

For example, the first solar cell 10a and the second solar cell 10b have substantially the same structure, but the first and second wirings 22a and 22b, the first and second extension wirings 24 and 26, or the like may be arranged differently. For example, after manufacturing the same solar cells 10 in plurality, one solar cell may be positioned as it is to be used as the first solar cell 10a, and the other adjacent thereto may rotate 180° to be used as the second solar cell 10b. That is, the first solar cell 10a and the second solar cell 10b may be positioned in an origin symmetrical state.

For example, alignment marks 50a and 50b having the same shape may be positioned at different positions in the first solar cell 10a and the second solar cell 10b. For example, in the first solar cell 10a, the first alignment mark 50a may be positioned on a left upper side in FIG. 3A and the second alignment mark 50b may be positioned on a right lower side in FIG. 3A, whereas, in the second solar cell 10b, the first alignment mark 50a may be positioned on the right lower side in FIG. 3B and the second alignment mark 50b may be positioned on the left upper side in FIG. 3B. It can be seen that one of the first and second solar cells 10a and 10b is positioned as it is by the alignment marks 50a and 50b and the other is positioned by rotating 180°.

The pair of the first and second solar cells 10a and 10b may be repeatedly positioned to form the solar cell string S configured of the plurality of solar cells 10. Then, the plurality of solar cells 10 may be manufactured and applied in the same process, and after the process of forming the solar cell 10 and the process of forming the insulating member 32 and the connection member 34 are performed in the same manner, the wiring material 22 may rotate of the solar cell 10 before or after attachment to implement the desired arrangement of the first and second electrodes 42 and 44 and the arrangement of the first and second wirings 22a and 22b or the first and second extension wirings 24 and 26.

However, the present disclosure is not limited thereto. Accordingly, the first and second solar cells 10a and 10b may be separately manufactured and used. For example, solar cells having the arrangements of the first and second conductive regions 32 and 34 and the first and second electrodes 42 and 44 suitable for the first solar cell 10a, and solar cells having the arrangements of the first and second conductive regions 32 and 34 and the first and second electrodes 42 and 44 suitable for 10b may be used separately. Also in this case, the arrangement of the first and second extension wirings 24 and 26 in the first solar cell 10a and the second solar cell 10b is the same as described above. In this case, various modifications such as the wiring forming the first extension wiring 24 and the wiring forming the second extension wiring 26 among the first and second wirings 22a and 22b being the same or opposite to each other are possible.

Looking at each solar cell 10 as a reference, the length L1 of the first outer portion 24a of the first extension wiring 24 in the first direction may be longer than the length L2 of the second outer portion 26a of the second extension wiring 26. For example, the fact that the lengths L1 and L2 are different from each other or that the length L1 of the first outer portion 24a is longer than the length L2 of the second outer portion 26a may mean having a difference of 10% or more or a difference of 0.1 mm or more based on the long one. However, the present disclosure is not limited thereto and includes all cases that may be determined to be different from each other.

In this case, the first side S1 and the second side S2 of each solar cell 10 may be positioned at an inter-cell distance (reference numeral D in FIG. 5, hereinafter the same) from another solar cell 10. That is, each solar cell 10 on the first side S1 of each solar cell 10 and the first-side solar cell positioned on the first side S1 thereof may be positioned at an inter-cell distance D, and each solar cell 10 on the second side S2 of each solar cell 10 and the second-side solar cell positioned on the second side S2 thereof may be positioned at the inter-cell distance D. Here, the inter-cell distance D may mean a distance (e.g., distance between the second side S2 and the first side S1 in a portion where an inclined portion 10S positioned at a corner of each solar cell 10 is not provided, for example, the shortest distance) between the second side S2 and the first side S1 that are main edges between adjacent solar cells 10. For example, referring to the first solar cell 10a illustrated in FIG. 1, the second solar cell 10b or a first end solar cell 101 positioned on the first side S1 thereof may be the first-side solar cell, and the second solar cell 10b or the first end solar cell 101 positioned on the second side S2 thereof may be the second-side solar cell. As another example, referring to the second solar cell 10b illustrated in FIG. 1, the first solar cell 10a or a second end solar cell 102 positioned on the first side S1 thereof may be the first-side solar cell, and the second solar cell 10b or the second end solar cell 102 positioned on the second side S2 thereof may be the second-side solar cell.

In the present embodiment, the length L1 of the first outer portion 24a is greater than the inter-cell distance D, and thus, a portion (reference numeral OP in FIG. 5, hereinafter the same) overlapping the first side solar cell may be provided, and the length L2 of the second outer portion 26a is smaller than the inter-cell distance D, and thus, the second outer portion may be spaced apart from the second-side solar cell. For example, the length of the overlapping portion OP (reference numeral L11 in FIG. 5, hereinafter the same) may be greater than the width (reference numeral W in FIG. 5, hereinafter the same) of the first or second extension wiring 24 or 26. This is in consideration of the stability of the connection of the wiring unit 22 of the adjacent solar cell 10, and this will be described in more detail later. However, the present disclosure is not limited thereto, and the length L11 of the overlapping portion OP may be equal to or smaller than the width W of the first or second extension wiring 24 or 26.

The length L1 (in particular, the length L11 of the overlapping portion OP) of the first outer portion 24a may be equal to or greater than a first end distance ED1 between the inner end portion 24b (i.e., the inner end portion 24b of the first extension wiring 24 adjacent to the second side S2 of the solar cell 10) of the first extension wiring 24 and the second side S2 of the solar cell 10 or a second end distance ED2 between the inner end portion 26b (i.e., the inner end portion 26b of the second extension wiring 24 adjacent to the first side S1 of the solar cell 10) of the second extension wiring 24 and the first side S1 of the solar cell 10. In particular, the length L11 of the overlapping portion OP may be greater than each of the first end distance ED2 and the second end distance ED2.

That is, when the first and second extension wirings 24 and 26 of the adjacent solar cell 10 are connected, the outer end portion 24c of the overlapping portion OP of the first extension wiring 24 corresponding to the second-side solar cell on the second side S2 of the solar cell 10 may be positioned inside the inner end portion 26b of the second extension wiring 26. For example, when the first and second extension wirings 24 and 26 of the adjacent solar cell 10 are connected, the overlapping portion OP of the first extension wiring 24 corresponding to the second-side solar cell on the second side S2 of the solar cell 10 may be positioned to overlap at least one of the first and second electrodes 142 and 144 adjacent to the second side S2 of the solar cell 10. This is in consideration of the stability of the connection of the wiring unit 22 of the adjacent solar cell 10, and this will be described in more detail later.

For example, the first end distance ED1 and the second end distance ED2 are substantially equal to each other, so, when viewed in the first direction, the inner end portion 24b of the first extension wiring 24 and the inner end portion 26b of the second extension wiring may be positioned to be symmetrical to each other. Here, substantially the same may mean that a difference in ratio of a smaller one of the first and second end distances ED1 and ED2 based on the larger one is within 10%. As a result, it is possible to stably secure the end distances ED1 and ED2 between the inner end portions 24b and 26b of the first extension wiring 24 and the second extension wiring 26 and the second side S2 and the first side S1 of the solar cell 10. This is different from the asymmetry in the first direction since the length L1 of the first outer portion 24a and the length L2 of the second outer portion 26a are different from each other.

In addition, the length L2 of the second outer portion 26a may be equal to or greater than the first end distance ED1 or the second end distance ED2. For example, the length L2 of the second outer portion 26a may be greater than the first end distance ED1 or the second end distance ED2. Alternatively, the length L2 of the second outer portion 26a may be equal to or greater than the separation distance (reference symbol SD in FIG. 5, hereinafter the same) (i.e., a value obtained by subtracting the length L2 of the second outer portion 26a from the inter-cell distance D) between the outer end portion 26c of the second outer portion 26a and the second side solar cell. For example, the length L2 of the second outer portion 26a may be greater than the separation distance SD. When the first and second extension wirings 24 and 26 of the adjacent solar cells 10 are connected, the second outer portion 26a is a portion forming a portion of the connection portion CP while overlapping each other with the first outer portion 24a. As described above, when the length L2 of the second outer portion 26a forming the connection portion CP is sufficiently secured, it is possible to improve the stability of the connection of the wiring unit 22 of the adjacent solar cell 10, and the like. This will be described in more detail later.

The connection structure of the first and second solar cells 10a and 10b and the solar cell string S including the same will be described in more detail with reference to FIGS. 4 to 6.

Figure 4:
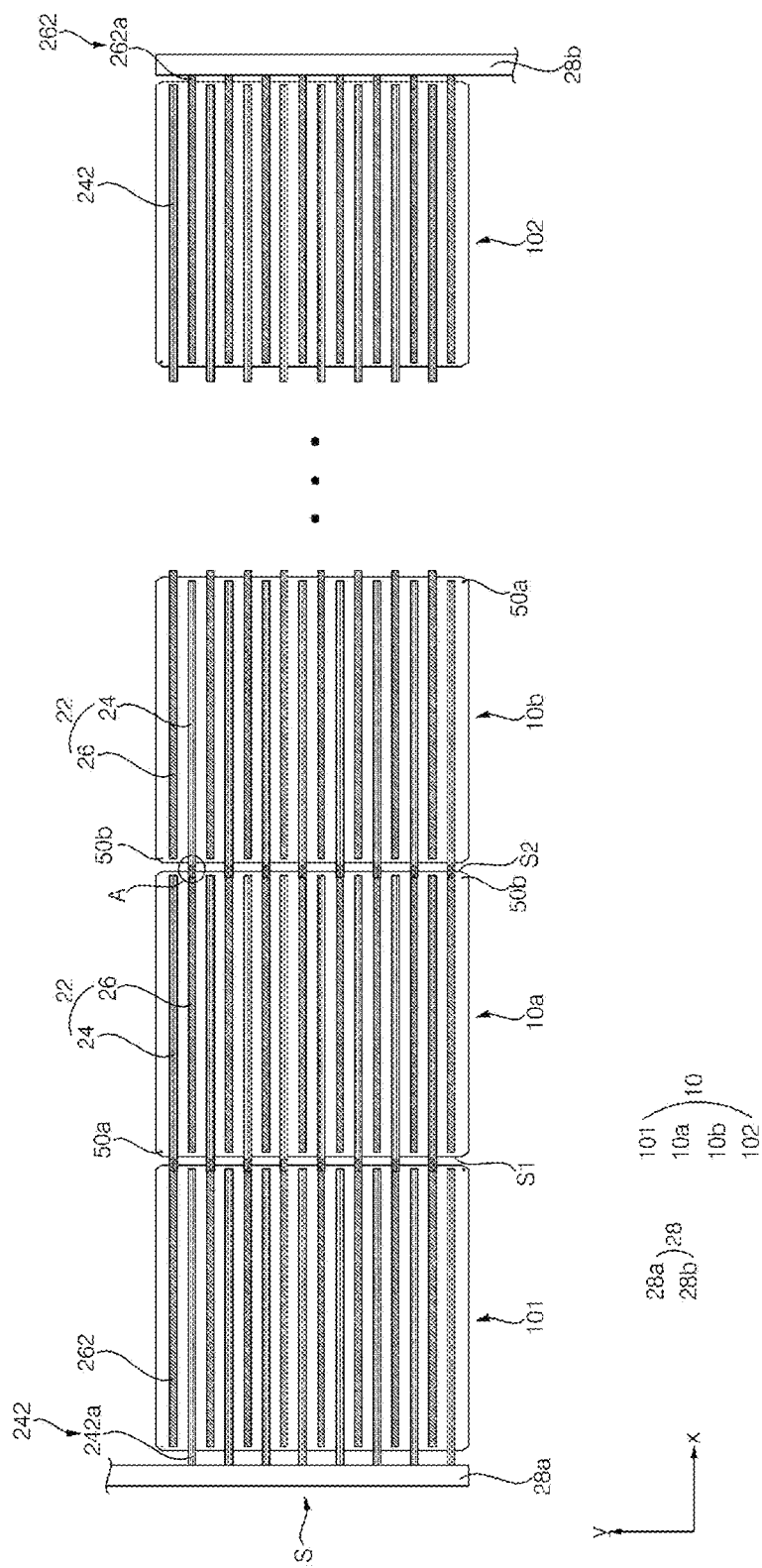
FIG. 4 is a rear plan view schematically illustrating a plurality of solar cells constituting one solar cell string included in the solar cell panel illustrated in FIG. 1 and wiring units connected thereto.

FIG. 4 is a rear plan view schematically illustrating the plurality of solar cells 10 constituting one solar cell string S included in the solar cell panel 100 illustrated in FIG. 1 and the wiring unit 20 connected thereto. FIG. 5 is a partial plan view illustrating enlarged portion A of FIG. 4, in which FIG. 5A is a front plan view and FIG. 5B is a rear plan view. FIG. 6 is a cross-sectional view of the solar cell panel 100 corresponding to line VI-VI of FIG. 5. For clear understanding, in FIG. 5B, the first and second electrodes 142 and 144 are schematically illustrated only in the first solar cell 10a.

Figure 5:
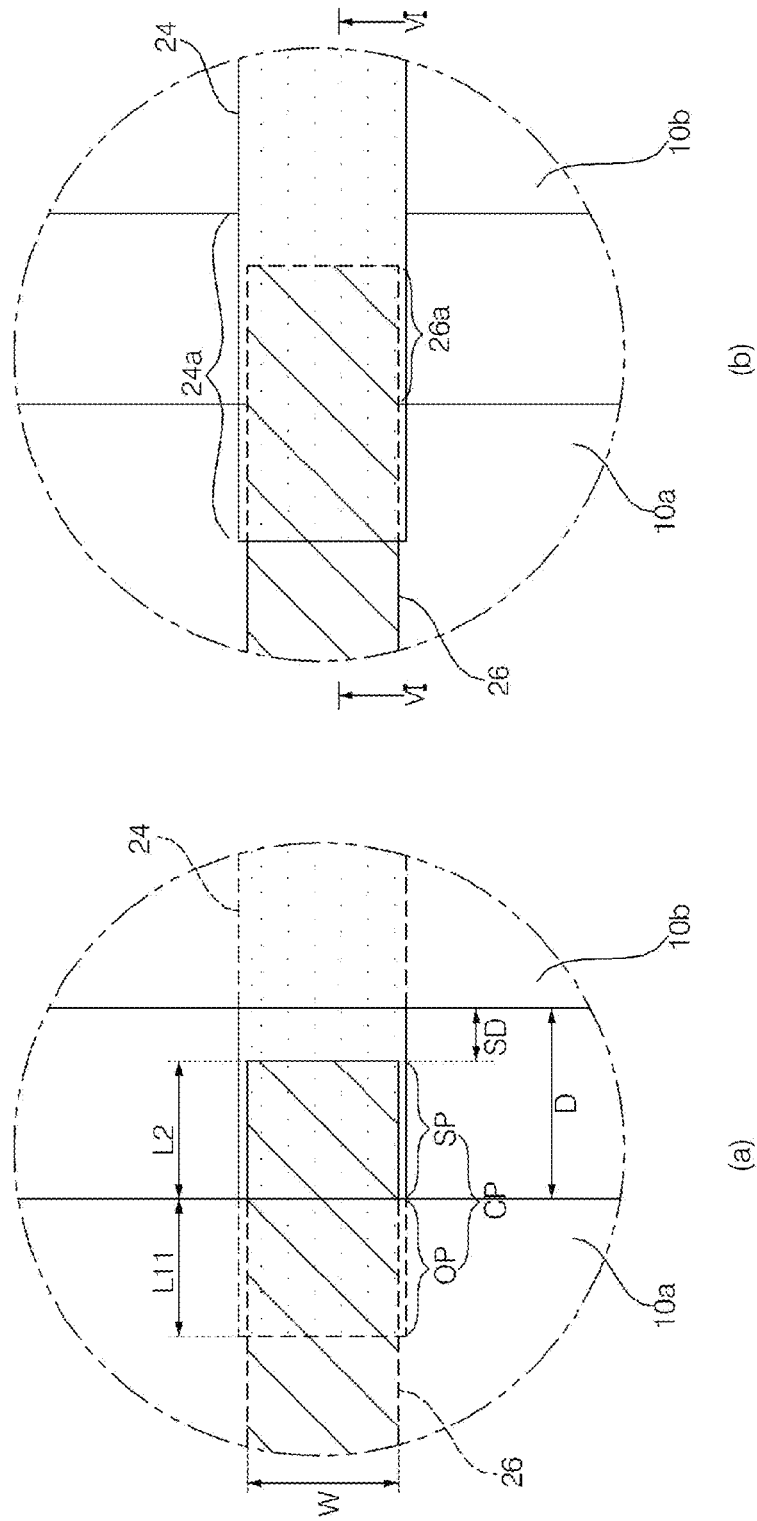
Figure 6:
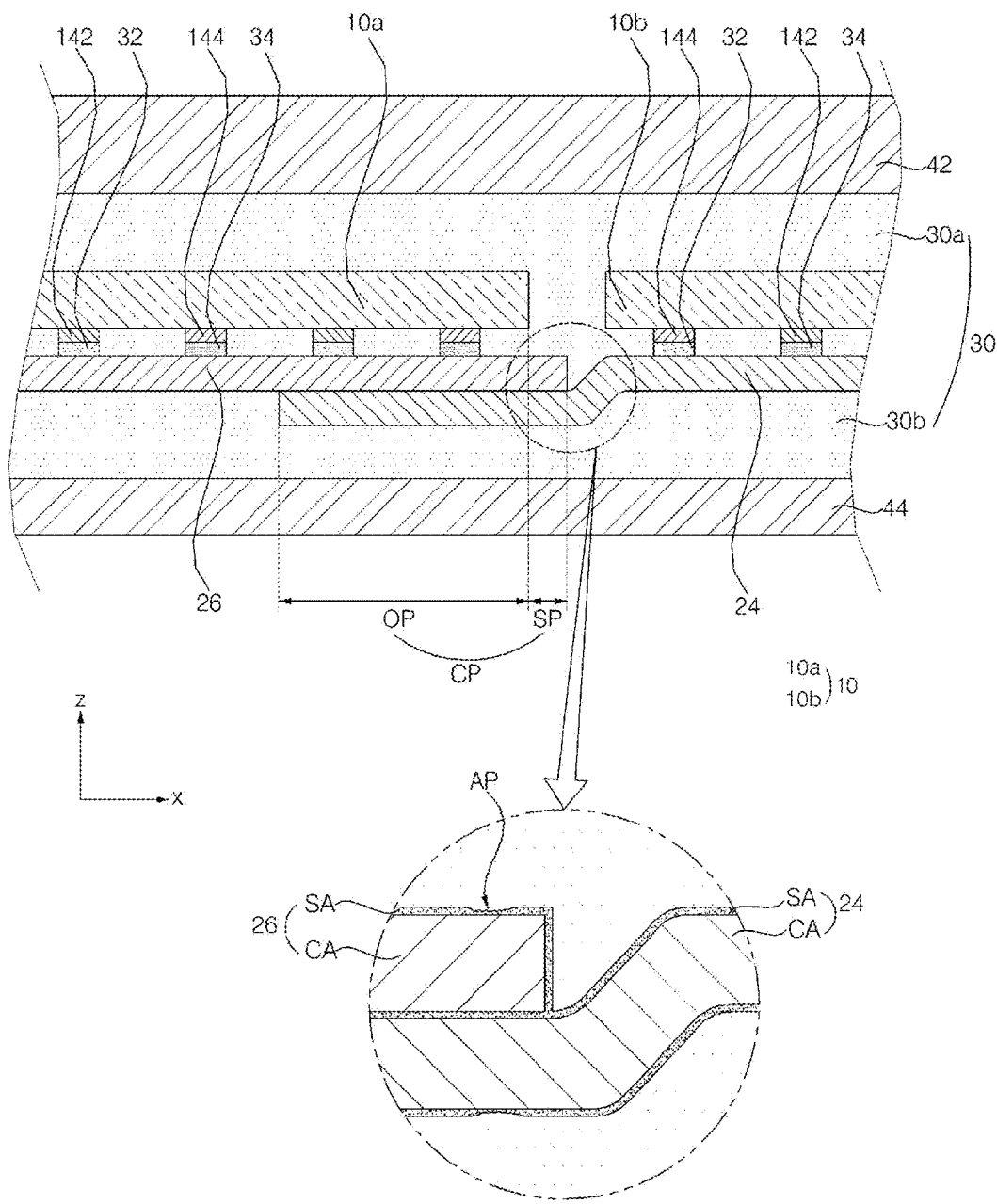
FIG. 6 is a cross-sectional view of the solar cell panel corresponding to line VI-VI of FIG. 5.

Referring to FIGS. 4 to 6, in the present embodiment, the first solar cell 10a and the second solar cell 10b are alternately positioned in the first direction, and the solar cell string S may be formed by connecting the first extension wiring 24 and the second extension wiring 26 adjacent to each other by extending from two adjacent solar cells 10 (e.g., the first solar cell 10a and the second solar cell 10b). In this case, the end solar cells 101 and 102 may be positioned adjacent to the bus bar wiring 28. In first or second extension wirings 242 or 262 corresponding to the end solar cells 101 and 102, first or second outer portions 242a or 262a positioned adjacent to the bus bar wiring 28 may have a different length than the first or second outer portion 24a or 26a of the first and second solar cells 10a and 10b (i.e., inner solar cell) to constitute the bus bar connection portion. For reference, in the present specification, each of the first and second extension wirings 24 and 26 is meant to include the first or second extension wirings 242 or 262, and the expression of the first or second extension wiring 242 or 262 is used only when the content corresponds to the first or second extension wiring 24 or 26 provided in the end solar cells 101 and 102.

First, the second extension wiring 26 of the first solar cell 10a and the first extension wiring 24 of the second-side solar cell (i.e., second solar cell 10b or second end solar cell 102) adjacent to the second side S2 of the first solar cell 10a are physically and electrically connected to each other on the second side S2 of the first solar cell 10a. Hereinafter, the connection structure of the first solar cell 10a and the second solar cell 10b on the second side S2 of the first solar cell 10a will be mainly described in detail. In this case, a connection portion CP is provided in which the second extension wiring 26 of the first solar cell 10a and the first extension wiring 24 of the second solar cell 10b are connected to each other by overlapping each other, and the connection portion CP may include the overlapping portion OP formed to overlap a portion of the first solar cell 10a.

More specifically, in the present embodiment, the second extension wiring 26 of the first solar cell 10a and the first extension wiring 24 of the second solar cell 10b may extend in a direction parallel to each other to be directly connected to each other or be connected by being in contact with each other. Here, "directly connected" may mean that the first and second extension wirings 24 and 26 are connected to each other without a separate member (e.g., a metal member, a ribbon member, a bridge ribbon connected in a direction intersecting the first and second extension wirings 24 and 26, and a separate wiring), etc. In this case, "directly connected" may include not only connecting the second extension wiring 26 of the first solar cell 10a and the first extension wiring 24 of the second solar cell 10b by being in contact with each other, but also connecting through a flux layer, an adhesive layer, etc., for improving adhesive properties.

That is, in the present embodiment, the second extension wiring 26 of the first solar cell 10a and the first extension wiring 24 of the second solar cell 10b that have a straight shape or a shape extending in parallel to each other in the first direction may be directly connected or contacted with each other. As described above, the second extension wiring 26 of the first solar cell 10a and the first extension wiring 24 of the second solar cell 10b are connected to each other without a bent portion, a folded portion, an intersecting portion, etc., and as a result, it is possible to effectively prevent problems such as stress concentration, damage, and torsion that may occur in the bent portion, the folded portion, the intersecting portion, and the like.

In this case, the connection portion CP may include the overlapping portion OP overlapping a portion of the first solar cell 10a and may be spaced apart from the second solar cell 10b. That is, the connection portion CP may include the overlapping portion OP overlapping a portion of the first solar cell 10a and an inter-cell portion SP positioned adjacent to the first solar cell 10a and spaced apart from the second solar cell 10b in the inter-cell region between the first solar cell 10a and the second solar cell 10b.

To this end, the length L1 of the first outer portion 24a of the first extension wiring 24 in the first direction may be longer than the length L2 of the second outer portion 26a of the second extension wiring 26. More specifically, the length L1 of the first outer portion 24a of the second solar cell 10b is greater than the inter-cell distance D, and thus, the overlapping portion OP may be provided to overlap the first solar cell 10a or the second extension wiring 26 positioned inside the first solar cell 10a. Since the length L2 of the second outer portion 26a of the first solar cell 10a is smaller than the inter-cell distance D, the portion where the second outer portion 26a is positioned in the inter-cell region constitutes the inter-cell of the connection portion CP, and the connection portion CP is not provided in the portion where the second outer portion 26a is not positioned on the second solar cell 10b side. Accordingly, in the inter-cell region, the connection portion CP may be spaced apart from the second solar cell 10b with a separation distance SD.

In this case, the first extension wiring 24 of the second solar cell 10b having the first extension portion 24a of the relatively long length L2 may be positioned on the rear surface of the second extension wiring 26 of the first solar cell 10a having the second extension portion 26a of the relatively short length L1 in the connection portion CP (in particular, overlapping portion OP). This is in consideration of a stable stacking structure of the second extension wiring 26 of the first solar cell 10a and the first extension wiring 24 of the second solar cell 10b.

As described above, when the first extension wiring 24 of the second solar cell 10b has the overlapping portion OP with the first solar cell 10a, it is possible to sufficiently secure the area of the second extension wiring 26 of the first solar cell 10a and the connection portion CP of the first extension wiring 24 of the second solar cell 10b, and improve the structural stability by the overlapping portion OP positioned on the first solar cell 10a. On the other hand, when the first and second extension wirings 24 and 26 individually corresponding to each solar cell 10 are connected only in the inter-cell region without the overlapping portion OP, the area of the connection portion is small, and the connection characteristics are reduced, so the first and second extension wirings 24 and 26 may be easily separated by the change in temperature, and the like.

In addition, the second extension wiring 26 of the first solar cell 10a may be formed to be spaced apart from the second solar cell 10b with the separation distance SD, thereby improving the electrical stability. That is, when the first extension wiring 24 of the second solar cell 10b is positioned on the rear surface of the second extension wiring 26 of the first solar cell 10a, if the second extension wiring 26 of the first solar cell 10a does not have the separation distance SD, a defect such as a portion of the second extension wiring 26 of the first solar cell 10a being positioned on the front surface of the second solar cell 10b may occur. The above-described defect and the like can be effectively prevented by the separation distance SD.

For example, the length L11 of the overlapping portion OP may be equal to or greater than the first end distance ED1. That is, the outer end portion 24c of the first extension wiring 24 of the second solar cell 10b on the second side S2 of the first solar cell 10a in the first direction may be positioned inside the first solar cell 10a rather than the inner end portion 24b of the first extension wiring 24a of the first solar cell 10a. For example, in the first solar cell 10a, the first extension wiring 24 (i.e., the overlapping portion OP) of the second solar cell 10b may be positioned to overlap at least one of the first and second electrodes 142 and 144 adjacent to the second side S2 of the solar cell 10 on the second extension wiring 26 of the first solar cell 10a. In addition, the length L1 of the first outer portion 24a may be greater than the width W of the first or second extension wiring 24 or 26. This is to sufficiently secure the length of the connection portion CP, that is, the sum (in particular, the length L11 of the overlapping portion OP) of the length L11 of the overlapping portion OP and the length (i.e., the length L2 of the second outer portion 26a) of the inter-cell portion SP of the overlapping portion OP.

In addition, the length L11 of the overlapping portion OP may be greater than the length L2 of the second outer portion 26a. According to this, the length of the overlapping portion OP or the area of the connection portion CP is sufficiently secured to improve the connection characteristics and structural stability of the first extension wiring 24 and the second extension wiring 26, thereby improving the reliability. However, the present disclosure is not limited thereto. Accordingly, the length L11 of the overlapping portion OP may be equal to or smaller than the length L2 of the second outer portion 26a. Then, it is possible to reduce the material costs by reducing the length of the first outer portion 24a or the first extension wiring 24, and to prevent a short circuit or the like that may occur when there is the misalignment of the first outer portion 24a. In addition, when the length of the overlapping portion OP is increased, a problem such as penetration of the encapsulant 30 between the first extension wiring 24 and the second extension wiring 26 stacked on each other in the overlapping portion OP may occur. However, when the length L11 of the overlapping portion OP is relatively short, this problem may be effectively prevented.

In addition, the length L2 of the second outer portion 26a of the first solar cell 10b may be equal to or greater than the first end distance ED1. For example, the length L2 of the second outer portion 26a may be greater than the width W of the first or second extension wiring 24 or 26. This is to sufficiently secure the length of the connection portion CP, that is, the sum (in particular, the length L11 of the overlapping portion OP) of the length L11 of the overlapping portion OP and the length (i.e., the length L2 of the second outer portion 26a) of the inter-cell portion SP of the overlapping portion OP. Alternatively, the length of the connection portion CP of the first extension wiring 24 and the second extension wiring 26 may be greater than the width W of the first or second extension wiring 24 or 26. This is to sufficiently secure the length of the connection portion CP.

Accordingly, the area of the connection portion CP of the first extension wiring 24 and the second extension wiring 26 may be sufficiently secured. However, the present disclosure is not limited thereto. When the width W of the first or second extension wiring 24 or 26 increases and the area of the connection portion CP increases, the length L2 of the first outer portion 24a and/or the second outer portion 26a, the length of the connection portion CP, and the like may be reduced. Accordingly, the length L1 of the first outer portion 24a may be equal to or greater than the width W of the first or second extension wirings 24 and 26. Alternatively, the length L2 of the second outer portion 26a may be equal to or greater than the width W of the first or second extension wirings 24 and 26. Alternatively, the length of the connection portion CP of the first extension wiring 24 and the second extension wiring 26 may be equal to or greater than the width W of the first or second extension wiring 24 or 26.

For example, the separation distance SD between the outer end portion 26c of the second extension wiring 26 of the first solar cell 10a and the second solar cell 10b may be 0.5 mm or more. Accordingly, the second extension wiring 26 and the second solar cell 10b are spaced apart from each other while having a stable separation distance SD to minimize interference between the second extension wiring 26 and the second solar cell 10b. Alternatively, the length L2 of the second outer portion 26a (i.e., the length of the inter-cell SP) may be greater than the separation distance SD. Accordingly, the area (in particular, the area of the inter-cell portion SP) of the connection portion CP of the first extension wiring 24 and the second extension wiring 26 may be maximized, thereby improving the structural stability. In particular, the inter-cell portion SP may include a pre joint portion AP formed by performing preliminary fixing or temporary fixing on the first outer portion 24a and the second outer portion 26a. Therefore, by maximizing the area of the inter-cell portion SP of the second outer portion 26a and the first outer portion 24a, it is possible to improve the process stability of the preliminary fixing or temporary fixing of the first extension wiring 24 and the second extension wiring 26. However, the present disclosure is not limited thereto, and the separation distance SD, the length L2 of the second outer portion 26a, and the like may be variously changed. For example, the length L2 of the second outer portion 26a may be equal to or smaller than the separation distance SD. Various other modifications are possible.

In the present embodiment, the inter-cell portion SP may be a portion joined before the lamination process and provided with a pre joint portion AP by performing the preliminary fixing or temporary fixing process of the second extension wiring 26 of the first solar cell 10a and the first extension wiring 24 of the second solar cell 10b. That is, in the present embodiment, in the state where the second extension wiring 26 of the first solar cell 10a and the first extension wiring 24 of the second solar cell 10b overlap each other in the inter-cell portion SP before the lamination process, a soldering process performed while applying heat and pressure to the first solar cell 10a and the first extension wiring 24 may be performed. As described above, a portion formed in contact with each other by the soldering process partially performed in the inter-cell portion SP may constitute the pre-joint portion AP.

In the present embodiment, the pre joint portion AP formed by the soldering process before the lamination process may be a portion having a thickness, surface roughness, or shape different from other portions. In particular, an outer portion of a conductive coating layer SA of the pre-joint portion AP may have a different thickness, surface roughness, or shape from the outer portion of the conductive coating layer SA of other portions. For example, the outer portion of the conductive coating layer SA of the pre joint portion A may have a thinner thickness than the outer portion of the conductive coating layer SA of other portions, the outer portion of the conductive coating layer SA of the pre joint portion A may have a larger surface roughness than the outer portion of the conductive coating layer SA of other portions, or the outer portion of the conductive coating layer SA of the pre joint portion A may have an irregular shape or an irregular surface than the outer portion of the conductive coating layer SA of other portions. This is formed by the pressure applied by the soldering process before the lamination process and may be viewed as a kind of pressed mark. However, even when the pre joint portion AP is formed in the soldering process, the conductive coating layer SA of the first and second extension wirings 24 and 26 may be melted in the lamination process as a whole, so the pre joint portion AP may not remain in the final structure. Alternatively, even if the conductive coating layer SA of the first and second extension wirings 24 and 26 is melted in the lamination process as a whole, a part, a difference in characteristics, or the like of the pre-joint portion AP may remain in the soldering process, and thus, remain in the final structure.

In the present embodiment, as described above, after the soldering process is performed only on the inter-cell portion SP to pre-fix the inter-cell portion SP, the overlapping portion OP may be fixed by the lamination process to lower the process time, the process temperature, or the like of the process of preliminarily fixing or temporarily fixing the second extension wiring 26 of the first solar cell 10a and the first extension wiring 24 of the second solar cell 10b. This will be described in more detail later.

For example, in the present embodiment, the area of the connection portion CP may be 3 to 16.5 mm$^2$ (e.g., 6 to 16.5 mm$^2$). This is limited to a length capable of maximizing the connection characteristics of the first extension wiring 24 and the second extension wiring 26 and reducing material cost. in consideration of all of the length L1 of the first extension wiring 24 and the length L2 of the second extension wiring 26, the overlapping width of the first extension wiring 24 and the second extension wiring 26 in the width direction, etc. Alternatively, the length L11 of the overlapping portion OP may be 1 to 8 mm (e.g., 2 mm to 7 mm, for example, 4 mm or more). This is to maximize the effect of improving the structural stability by the overlapping portion OP. However, the present disclosure is not limited thereto, and the area of the connection portion CP, the length L11 of the overlapping portion OP, and the like may be variously modified.

Similarly, the first extension wiring 24 of the first solar cell 10a on the first side S1 of the first solar cell 10a and the first extension wiring 24 of the first solar cell 10a (i.e., the second solar cell 10b or the first end solar cell 101) adjacent to the first side S1 of the first solar cell 10a are physically and electrically connected to each other on the second side S2 of the first solar cell 10a. The above-described connection structure of the second extension wiring 26 of the first solar cell 10a and the first extension wiring 24 of the second solar cell 10b may be applied to the connection structure between the second extension wiring 26 of another second solar cell 10b and the first extension wiring 24 of the first solar cell 10a as it is.

The first end solar cell 101 may have, for example, the same arrangement of the first and second electrodes 142 and 144 and the first and second extension wirings 242 and 262 as the second solar cell 10b, but the first outer portion 242a of the first extension wiring 242 connected to the first bus bar wiring 28a may have a length suitable for the connection to the first bus bar wiring 28a. For example, the first outer portion 242a of the first extension wiring 242 connected to the first bus bar wiring 28a may be equal to or greater than or smaller than the length of the first outer portion of the first extension wiring 24 of the second solar cell 10b. This is because the first outer portion 24a of the second solar cell 10b has a relatively long length L1. For example, when the first outer portion 242a of the first extension wiring 242 connected to the first bus bar wiring 28a is equal to the length L1 of the first outer portion 242a of the first extension wiring 24 of the second solar cell 10b, the second solar cell 10b may be used as the first end solar cell 101 as it is, so it is possible to simplify the process of manufacturing the solar cell 10.

The second end solar cell 102 may have, for example, the same arrangement of the first and second electrodes 142 and 144 and first and second extension wirings 242 and 262 as the first solar cell 10a, but the second outer portion 262a of the second extension wiring 262 connected to the second bus bar wiring 28b may have a length suitable for the connection to the first bus bar wiring 28a. For example, the second outer portion 262a of the second extension wiring 26 connected to the second bus bar wiring 28a may be greater than the length of the second outer portion 26a of the second extension wiring 26 of the first solar cell 10a. This is considering that the second outer portion 26a of the first solar cell 10a has a relatively small length L2. For example, when the length of the second outer portion 262a of the second extension wiring 262 connected to the second bus bar wiring 28b is equal to the length L1 of the first outer portion 24a of first extension wiring 24 in the first solar cell 10a or the second end solar cell 102, the structural stability may be improved, and the second end solar cell 102 may be formed by applying the wiring having the same length as the second extension wiring 262, thereby simplifying the manufacturing process.

However, the present disclosure is not limited thereto, and the length of the first or second outer portions 242a or 262a of the first and second end solar cells 101 and 102 connected to the first and second bus bar wirings 28a and 28b may be variously changed.

As described above, the connection structure of the adjacent solar cells 10, that is, the first end solar cell 101 and the first solar cell 10a, the first solar cell 10a and the second solar cell 10b, and the second solar cell 10b ad the first solar cell 10a, the first solar cell 10a and the second end solar cell 102 may be repeated to constitute the solar cell string S. Accordingly, by repeatedly performing the process of overlapping the first outer portion 24a of the other solar cell 20 on the second outer portion 26a of one solar cell 10 to form the connection portion CP (in particular, overlapping portion OP) among two adjacent solar cells 10, it is possible to stably connect the first extension wiring 24 and the second extension wiring 26 Accordingly, the solar cell string S can be formed through a simple manufacturing process. However, the present disclosure is not limited thereto, and the arrangement or the like of the first solar cell 10a, the second solar cell 10b, the first end solar cell 101, and the second end solar cell 102 may be variously modified.

In this case, in the present embodiment, the first and second extension wirings 24 and 26 (or the first and second wirings 22a and 22b) have different materials, different melting points, different materials, different yield strengths, and the like from those of the bus bar wiring 28. In the present embodiment, this is because there may be a difference in the connection process between the first and second extension wirings 24 and 26 and the connection process between the first or second extension wiring 24 or 26 and the bus bar wiring 28. More specifically, this is because the first extension wiring 24 and the second extension wiring 26 are substantially fixed in the lamination process after being connected through the preliminary fixing or temporary fixing, and the first or second extension wiring 24 or 26 (in particular, the first or second extension wirings 242 or 262) and the bus bar wiring 28 are fixed by the soldering process before the lamination process.

In the present embodiment, each of the first or second extension wiring 24 or 26 or the bus bar wiring 28 may include a conductive material (e.g., a metal material). For example, the first or second extension wiring 24 or 26 or the bus bar wiring 28 may include a core CA that has conductivity including any one of gold (Au), silver (Ag), copper (Cu), or aluminum (Al) and a conductive coating layer (e.g., solder layer) SA that is positioned on a surface of the core CA and may include tin (Sn) or an alloy including the same.

For example, the first or second extension wiring 24 or 26 or the core CA of the bus bar wiring 28 are made of copper Cu, resulting in reducing material costs and having excellent electrical conductivity.

In addition, the melting point of the first or second extension wiring 24 or 26 may be lower than that of the bus bar wiring 28. In this specification, the melting point of the first or second extension wiring 24 or 26 may mean the melting point of the conductive coating layer SA of the first or second extension wiring 24 or 26, and the melting point of the bus bar wiring 28 may mean the melting point of the conductive coating layer SA of the bus bar wiring 28. For example, the melting point of the first or second extension wiring 24 or 26 may be 120° C. to 150° C., and the melting point of the bus bar wiring 28 is 150° C. to 180° C. (exceeding 150° C. and less than 180° C.). Alternatively, the conductive coating layer SA of the first or second extension wiring 24 or 26 may contain a tin-bismuth alloy (SnBi), and the conductive coating layer SA of the bus bar wiring 28 may contain a tin-lead alloy (SnPb). In the embodiment of these melting points, materials, and the like, the connection process between the first and second extension wirings 24 and 26 and the connection process between the first or second extension wiring 24 or 26 and the bus bar wiring 28 are considered. However, the present disclosure is not limited thereto, but may be variously modified.

In addition, the first extension wiring 24 and the second extension wiring 26 may have a relatively high yield strength considering that the overlapping portion OP is provided. For example, the yield strength of the first or second extension wiring 24 or 26 may be 80 to 170 MPa (more specifically, 110 Ma or more, for example, 130 MPa or more). To this end, a process of increasing yield strength of the first or second extension wiring 24 or 26 may be additionally performed before the first or second extension wiring 24 or 26 are attached to the solar cell 10. This will be described in more detail later in the method for manufacturing a solar cell panel 100. That is, since the overlapping portion OP overlapping a portion of the solar cell 10 adjacent to the first extension wiring 24 is provided, it is possible to minimize deformation of the solar cell 10 only when the first extension wiring 24 has a relatively high yield strength, and to prevent a lifting phenomenon of the first extension wiring 24 positioned on the second extension wiring 26 in the overlapping portion OP.

In addition, the yield strength of the bus bar wiring 28 may be equal to or lower than that of the first or second extension wiring 24 or 26. In particular, the yield strength of the bus bar wiring 28 may be lower than that of the first or second extension wiring 24 or 26. For example, the yield strength of the bus bar wiring 28 may be 70 to 120 MPa. This is because the bus bar wiring 28 is not a wiring directly connected to the solar cell 10, and thus, a separate process of increasing yield strength may not be added or the degree of increasing the yield strength may not be increased. By making the yield strength of the bus bar wiring 28 relatively low, the bus bar wiring 28 may be easily connected to the first or second extension wiring 24 or 26 (i.e., the first or second extension wiring 24 or 26) by the soldering process. However, the present disclosure is not limited thereto, and the yield strength of the bus bar wiring 28 may be higher than that of the first or second extension wiring 24 or 26. Various other modifications are possible.

According to the present embodiment, the area (in particular, the overlapping portion OP) of the connection portion CP is sufficiently secured by including the first and second extension wirings 24 and 26 corresponding to each solar cell 10 and having different lengths L1 and L2, thereby improving the connection characteristics and improve the structural stability. In this case, since the first and second extension wirings 24 and 26 extend portion parallel to each other and are directly connected to each other, it is possible to reduce material costs and simplify a process by having a simple structure that does not include wirings intersecting the first and second extension wirings. Accordingly, it is possible to improve the reliability and productivity of the solar cell panel 100.

The above-described method for manufacturing a solar cell panel 100 will be described with reference to FIG. 7 together with FIGS. 1 to 6.

Figure 7:
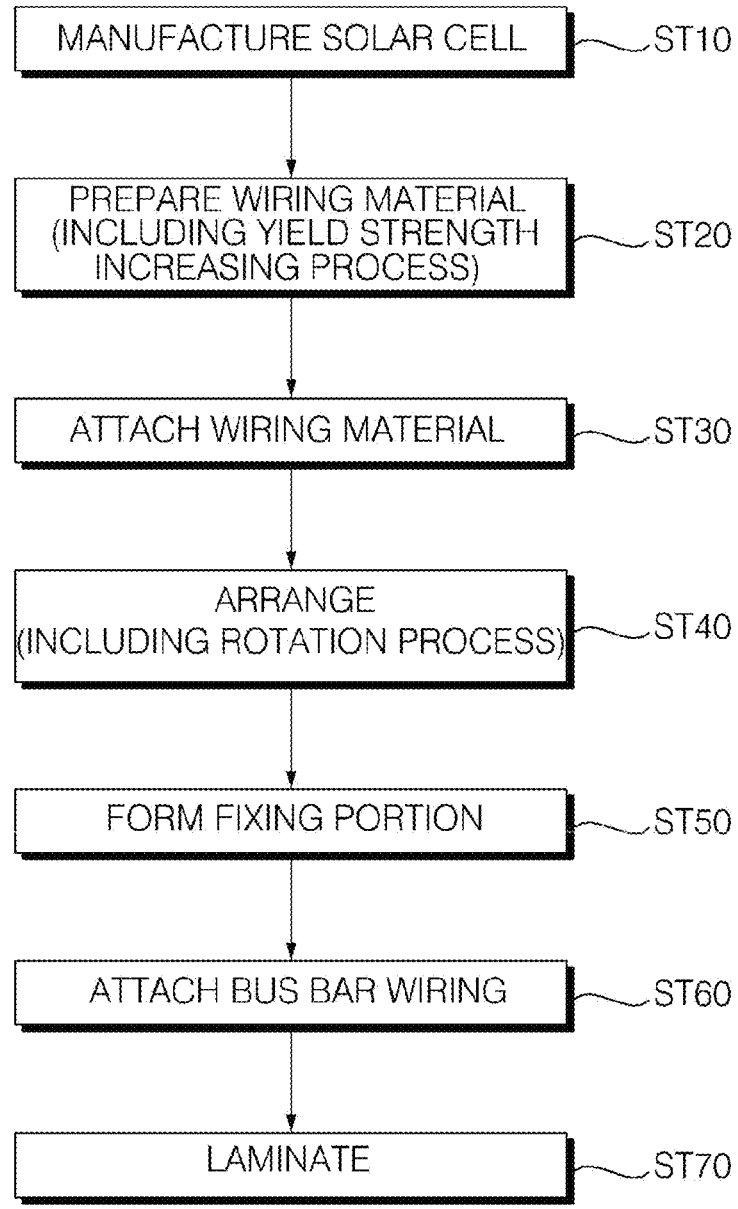
FIG. 7 is a flowchart illustrating a method for manufacturing a solar cell panel according to an embodiment of the present disclosure.

FIG. 7 is a flowchart illustrating the method for manufacturing a solar cell panel 100 according to an embodiment of the present disclosure.

First, in the solar cell manufacturing step ST10, the plurality of solar cells 10 as illustrated in FIG. 2 are manufactured. Various known processes known as a process of manufacturing the solar cell 10 may be applied. Then, the connection member 32 and the insulating member 34 are formed according to a predetermined pattern. Various known processes known as the process of manufacturing the solar cell 10 and for forming the connection member 32 and the insulating member 34 may be applied.

Next, in the wiring material preparing step ST20, the wiring material 22 to be attached to the solar cell 10 is prepared. In the present embodiment, the wiring material preparing step ST20 may include a yield strength increasing process of increasing yield strength of the wiring material 22. Here, the yield strength increasing process is a process of treating the first and second extension wirings 24 and 26 to be attached corresponding to each solar cell 10 to have a relatively high yield strength. As such, when the first and second extension wirings 24 and 26 have a relatively high yield strength, it is possible to minimize the deformation of the solar cell 10 and prevent the lift phenomenon of the first extension wiring 24 positioned on the second extension wiring 26 in the overlapping portion OP.

Here, the yield strength increasing process may be performed by various methods, and may be performed by increasing the yield strength by tensioning in a process of unwinding a base wiring wound on a spool, for example. In this case, the first and second extension wirings 24 and 26 may be processed to have a desired shape, pattern, or the like. In addition, the first and second extension wirings 24 and 26 having a desired yield strength and a desired length may be manufactured by being cut to a predetermined length after the yield strength increasing process. When the yield strength increasing process is performed by stretching the base wiring in the process of unwinding the base wiring as described above, the yield strength may be increased without adding a separate process, thereby simplifying the process.

For example, the yield strength of the base wiring may be 50 to 120 MPa, and the yield strength of the first and second extension wirings 24 and 26 subjected to the yield strength increasing process may be 80 to 170 MPa. For example, in the yield strength increasing process, the yield strength may be increased by 10 to 100 MPa (e.g., 20 to 50 MPa). When the yield strength exceeds 100 MPa (e.g., 50 MPa) in the yield strength increasing process, the process becomes difficult and other characteristics other than the yield strength are lowered, and thus, the reliability may be reduced.

Next, in the wiring material attaching step ST30, the first extension wiring 24 and the second extension wiring 26 corresponding to each solar cell 10 are attached using the connection member 32. In this case, the first extension wiring 24 and the second extension wiring 26 corresponding to each solar cell 10 may be attached by making the arrangement, the length, and the like of the first extension wiring 24 and the second extension wiring 26 correspond to the arrangement, the length, and the like of the first solar cell 10a, the second solar cell 10b, the first end solar cell 101, and the second end solar cell 102. That is, the wiring material 22 is attached on the plurality of solar cells 10, and the first extension wiring and the second extension wiring may be attached by making the arrangement, the length, and the like of the first extension wiring 24 and the second extension wiring 26 different from each other so as to correspond to the second end solar cell 102.

In addition, after attaching the wiring material 22 on each solar cell 10, an intra-cell fixing member covering the solar cell 10 and the wiring material 22 may be further positioned on the rear surface of the solar cell 10 for more stable fixing. Here, the intra-cell fixing member may have various materials or shapes, and may be formed of, for example, an insulating tape containing an adhesive material or a cohesive material. For example, the intra-cell fixing member may have a shape extending long in the second direction while having a constant width in the first direction to cover a portion of the solar cell 10 and the wiring material 22. As the intra-cell fixing member, the fixing member 29 described with reference to FIGS. 8 and 9 may be applied as it is, and thus, a detailed description thereof will be omitted.

Subsequently, in the solar cell arrangement step ST40, the plurality of solar cells 10 may be arranged in a desired order, including a rotation input process. That is, a portion of the plurality of solar cells 10 to which the wiring material 22 is attached may be put in as it is, and other portions may rotate 180° to form the arrangement of the solar cell strings S.

For example, the first end solar cell 101 may be put by rotating 180°. In addition, the process of putting the first solar cell 10a as it is and putting the second solar cell 10b by rotating the second solar cell 10b by 180° may be repeated plural times. The second end solar cell 120 may be put in as it is. Accordingly, the arrangement of the solar cells 10 constituting the solar cell string S can be completed.

In this case, the first extension wiring 24 of the solar cell 10 input later is positioned on the second extension wiring 26 of the solar cell 10 input first from two adjacent solar cells 10 to constitute the connection portion CP. In this case, the first extension wiring 24 of the solar cell 10 input later is disposed to overlap the solar cell 10 input first to constitute the overlapping portion OP.

More specifically, the first extension wiring 24 of the first solar cell 10a is positioned on the rear surface of the second extension wiring 262 of the first end solar cell 101. For example, the first extension wiring 24 of the first solar cell 10a is directly connected on the rear surface of the second extension wiring 26 in the first end solar cell 101, and thus, is positioned in a state in which the overlapping portion OP is formed.

Then, the first extension wiring 24 of the second solar cell 10b is positioned on the rear surface of the second extension wiring 26 of the first solar cell 10a. For example, the first extension wiring 24 of the second solar cell 10b is directly connected on the rear surface of the second extension wiring 26 in the first solar cell 10a, and thus, is positioned in a state in which the overlapping portion OP is formed. In addition, the first extension wiring 24 of another first solar cell 10a is positioned on the rear surface of the second extension wiring 26 of the second solar cell 10b. For example, the first extension wiring 24 of another first solar cell 10a is directly connected on the rear surface of the second extension wiring 26 in the second solar cell 10b, and thus, is positioned in a state in which the overlapping portion OP is formed. By repeating this process, the plurality of first solar cells 10a and the plurality of second solar cells 10b are alternately arranged in order.

In addition, the first extension wiring 24 of the second end solar cell 102 is positioned on the rear surface of the second extension wiring 26 of the second solar cell 10b. For example, the first extension wiring 24 of the second end solar cell 102 is directly connected on the rear surface of the second extension wiring 26 in the second solar cell 10b, and thus, is positioned in a state in which the overlapping portion OP is formed.

Subsequently, in the fixing portion forming step ST50, fixing portions for fixing the first and second extension wirings 24 and 26 provided in two adjacent solar cells 10 are formed. Here, the fixing portion may be formed in a region including at least a portion of the connection portion CP.

In the present embodiment, the fixing portion may be formed of the pre joint portion AP that is partially formed in the inter-cell portion SP. The pre joint portion AP may be formed by the soldering process that applies heat and pressure. More specifically, the pre joint portion AP may be formed by a preliminary soldering process of preliminarily fixing the first and second extension wirings 24 and 26. In the present embodiment, this is because the first and second extension wirings 24 and 26 of the solar cells 10 adjacent to each other are joined in the lamination process, and thus, the pre joint portion AP only serves to prevent distortion, deformation, and the like of the first and second extension wirings 24 and 26 before the lamination process. Accordingly, the temperature of the preliminary soldering process of forming the pre-joint portion AP may be lower than that of a soldering process of connecting the plurality of wiring units 20 (e.g., a soldering process of connecting the first or second extension wirings 242 or 262 and the bus bar wiring 28).

For example, the temperature of the preliminary soldering process may be 300 to 400° C., and the temperature of the soldering process (e.g., the soldering process of connecting the first or second extension wirings 242 or 262 and the bus bar 28) of connecting the plurality of wiring units 20 may be 400 to 500° C. (for example, exceeding 400° C. and 500° C. or lower). The temperature of the preliminary soldering process is relatively low, but is a temperature higher than the melting points of the first and second extension wirings 24 and 26, which is to increase the process speed. However, the present disclosure is not limited thereto, but may be variously modified.

This preliminary soldering process may be performed by various methods and apparatuses, and the like, and may be performed by using, for example, a pulse heater. That is, the pre joint portion AP may be formed by providing heat by the pulse heater while providing pressure to the inter-cell portion SP. Since the pulse heater has a temperature increase rate, it is possible to stably form the pre joint portion AP. As described above, the pre-joint portion AP may have a thickness, surface roughness, or shape different from other portions and other portions, and may have, for example, a pressed mark.

Subsequently, in the bus bar wiring attaching step ST60, the plurality of solar cell strings S may be arranged in the second direction, and end portions of the solar cell strings S may be alternately connected to the bus bar wiring 28. For example, in one solar cell string S and a solar cell string S adjacent thereto in the second direction, the first end solar cell 101 and the second end solar cell 102 may be arranged to be alternately positioned in the second direction. The first bus bar wiring 28a may connect the first end solar cell 101 of one solar cell string S to the second end solar cell 102 of another solar cell string S positioned on one side in the second direction, and the second bus bar wiring 28b may connect the second end solar cell 102 of one solar cell string S to the first end solar cell 101 of another solar cell string S positioned on the other side in the second direction. More specifically, the bus bar wiring 28 extends in a second direction intersecting the first extension wiring 242 of the first end solar cell 101 and the second extension wiring 262 of the second end solar cell 102, and thus, may be fixed by the soldering process in the portion overlapping the first extension wiring 242 and the second extension wiring 262. Accordingly, the plurality of solar cell strings S connected in series may be formed. However, the present disclosure is not limited thereto, but may be variously modified.

In the present embodiment, the yield strength increasing process is not performed on the bus bar wiring 28, or the yield strength may be equal to or lower than that of the first and second extension wirings 24 and 26 even if the yield strength increasing process is performed. Since the first and second extension wirings 24 and 26 are not portions that are not directly connected to the solar cell 10, the first and second extension wirings 24 and 26 are relatively easily deformed, so it is possible to prevent the bus bar wiring 28 from peeling off.

In addition, the bus bar wiring step (ST60) may be performed by the soldering process. As described above, the temperature of the preliminary soldering process of forming the pre joint portion AP may be lower than the temperature of the soldering process of performing the bus bar wiring attaching step ST60, and the temperature of the soldering process of performing the bus bar wiring attaching step ST60 may be 400 to 500° C. (for example, exceeding 400° C. and 500° C. or lower). Accordingly, the bus bar wiring 28 and the first and second extension wirings 24 and 26 may be completely soldered in a portion overlapping each other.

In the bus bar wiring attaching step (ST60), the joint portion having a thickness, surface roughness, or shape different from other portions may be formed on the first or second extension wirings 24 and 26 and the bus bar wiring 28. The joint portion may have properties similar to those of the pre joint portion AP.

For example, the joint portion may be a portion having a different thickness, surface roughness, or shape from other portions. In particular, the outer portion of the conductive coating layer SA of the joint portion may have a different thickness, surface roughness, or shape from the outer portion of the conductive coating layer SA of other portions. For example, the outer portion of the conductive coating layer (SA) of the joint portion has a thinner thickness than the outer portion of the conductive coating layer (SA) of other portions, the outer portion of the conductive coating layer SA of the joint portion has a greater surface roughness than the outer portion of the conductive coating layer SA of other portions, or the outer portion of the conductive coating layer SA of the joint portion may have a more irregular shape or irregular surface than the outer portion of the conductive coating layer SA of other portions This is formed by the pressure applied by the soldering process before the lamination process and may be viewed as a kind of pressed mark.

Subsequently, in the lamination step ST70, the first cover member 42, the first encapsulant 30a, the plurality of solar cell strings S connected by the first cover member 42, the second encapsulant 30b, and the second cover member 44 may be integrated by heat and pressure, thereby manufacturing the solar cell panel 100.

More specifically, the first cover member 110, the first encapsulant 30a, the plurality of solar cell strings S connected by the first cover member 42, the second encapsulant 30b, and the second cover member 44 may be sequentially positioned on a worktable of the lamination apparatus, thereby forming a laminated structure. As an example, the first cover member 42 formed of a glass substrate may be positioned on the worktable side of the lamination apparatus, and the first encapsulant 30a, the plurality of solar cell strings S connected by the bus bar wiring 28, the second encapsulant 30b, the second cover member 44, and the like may be sequentially positioned thereon, but the present disclosure is not limited thereto, and various modifications are possible. Subsequently, the lamination process of applying heat and pressure to the laminated structure is performed. Then, the first encapsulant 30a and the second encapsulant 30b are melted and then hardened and compressed by pressure, so the space between the first cover member 42 and the second cover member 44 may be completely filled with the encapsulant 30. As a result, the plurality of solar cell strings S connected by the bus bar wiring 28 may be sealed while the space between the first cover member 42 and the second cover member 44 is completely filled with the encapsulant 30. Accordingly, the solar cell panel 100 having a desired shape is manufactured.

The lamination process may be performed at a temperature capable of melting the first and second encapsulants 30a and 30b, and may be performed at, for example, 160 to 180° C. In the present embodiment, the melting point of the first or second extension wiring 24 or 26 may be lower than the temperature of the lamination process, and may be, for example, 120° C. to 150° C. Accordingly, the conductive coating layer SA may be melted in the connection portions CP of the first and second extension wirings 24 and 26 as a whole to be joined to each other. Accordingly, before the lamination process, the process of soldering the overlapping portions CP of the first and second extension wirings 24 and 26 as a whole is not required, so the preliminary fixing may be performed only with a preliminarily performing fixing portion (pre joint portion AP or fixing member (reference numeral 29 in FIG. 9)) formed of the soldering process or the like for the preliminary fixing or the temporary fixing.

As described above, since the conductive coating layer SA of the first and second extension wirings 24 and 26 having a melting point lower than the temperature of the lamination process is melted in the lamination process as a whole, even if the pre-joint portion AP disappears or remains after the lamination process, the difference in shape from other portions may not be large. since the portions in which the conductive coating layers SA of the first and second extension wirings 24 and 26 is in contact with each other in the pre joint portion AP are melted together as a whole, as illustrated in the enlarged circle of FIG. 6, the conductive coating layers SA of the first and second extension wirings 24 and 26 are integrated, so that no boundary is provided therebetween. On the other hand, since the conductive coating layer SA of the bus bar wiring 28 having a relatively high melting point is not melted in the lamination process, the joint portion or the pressed mark formed on the conductive coating layer SA of the bus bar wiring 28 may remain as it is even after the lamination process is performed, or may have a larger difference in shape from other portions than the pre joint portion AP. In addition, since the conductive coating layer SA of the bus bar wiring 28 and the conductive coating layer SA of the first or second extension wiring 24 or 26 are made of different materials, after the lamination process, a boundary surface exists between the conductive coating layer SA of the bus bar wiring 28 and the conductive coating layer SA of the first or second extension wiring 24 or 26 as it is.

According to the manufacturing method according to the present embodiment, the plurality of solar cells 10 are formed, some of the plurality of solar cells 10 are put in as they are, and others thereof are rotated and put, so the solar cell panel 100 having the desired structure and arrangement of the solar cells 10 and the wiring unit 20 may be manufactured with a simple process. In addition, since the first and second extension wirings extending in parallel are connected to each other to have the overlapping portion CP to form only the fixing portion for the preliminary fixing before the lamination process, the process may be further simplified. In addition, in the wiring material preparing step ST20, the first and second extension wirings 24 and 26 may have desired characteristics by performing the yield strength increasing process. Accordingly, it is possible to manufacture the solar cell panel 100 having excellent reliability with a simple process.

In the above description, it has been described that the solar cell arrangement step ST40 performed after the wiring material attaching step ST30 includes a rotation process. However, it is possible to perform the rotation process in other processes. For example, the wiring material 22 may be attached after the rotation process of some of the solar cells 10 is first performed before the wiring material attaching step ST30. Various other modifications are possible.

In addition, in the present embodiment, in this case, after arranging all of the plurality of solar cells 10 corresponding to the solar cell string S in the solar cell arrangement step ST40, the fixing portion forming step ST50 may be performed. Alternatively, during arranging all the plurality of solar cells 10 corresponding to the solar cell string S in the solar cell arrangement step ST40, the fixing portion forming step ST50 may be performed together. That is, after first and second extension wirings 24 and 26 of two solar cells 10 overlap each other, the process of forming the fixing portions of the corresponding first and second extension wirings 24 and 26 is performed, and the process may be repeatedly performed.

Hereinafter, a solar cell panel and a method for manufacturing the same according to another embodiment of the present disclosure will be described in detail. A detailed description of the same or extremely similar parts as or to the above description will be omitted and only different parts will be described in detail. The above-described embodiment or modified examples thereof and a combination of the following embodiments or the modified examples thereof also fall within the scope of the present disclosure.

Figure 8:
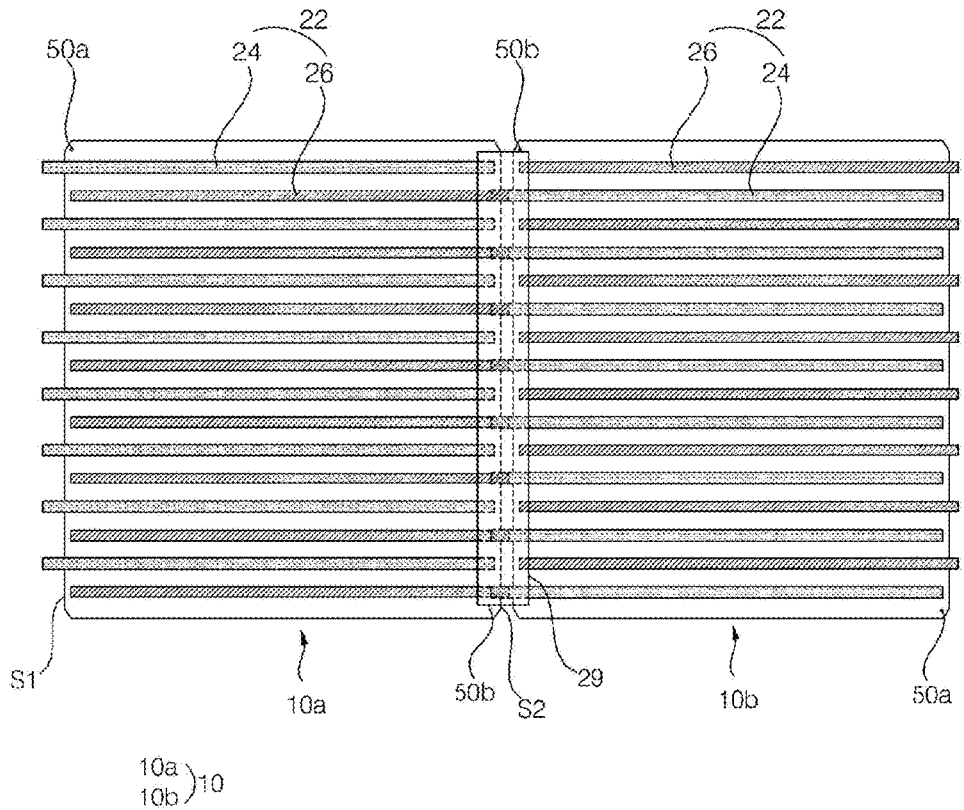
FIG. 8 is a plan view illustrating first and second solar cells included in a solar cell panel according to another embodiment of the present disclosure.
Figure 9:
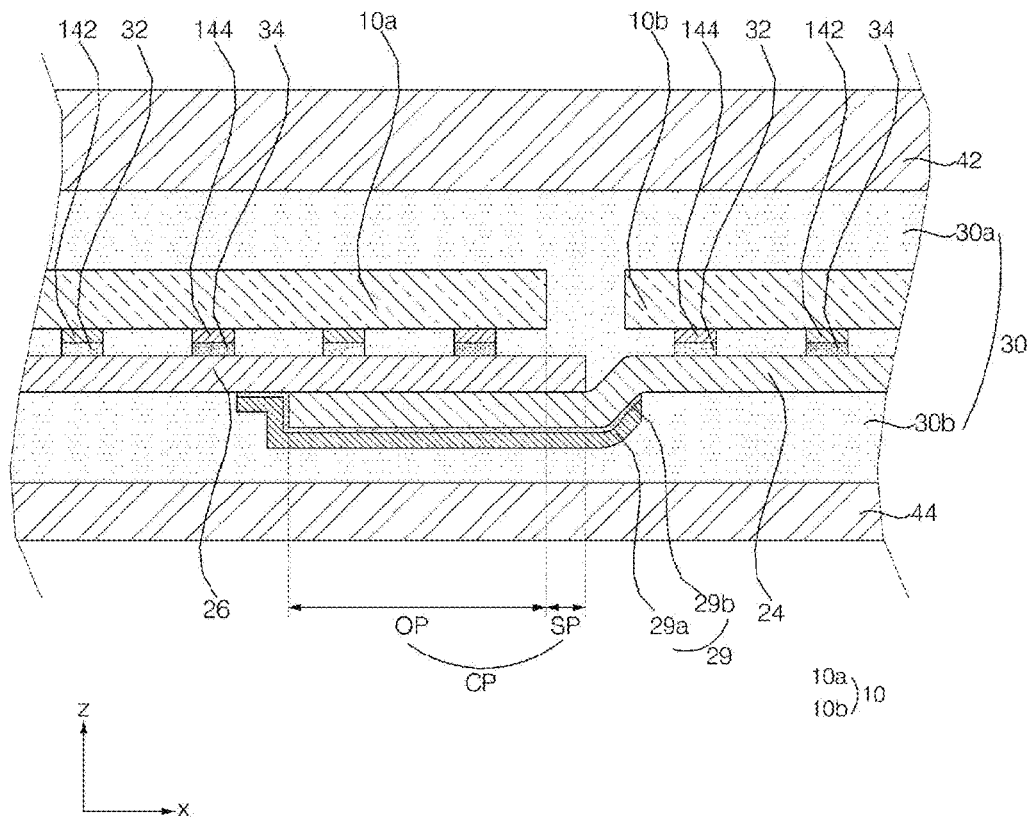
FIG. 9 is a cross-sectional view of the solar cell panel corresponding to line IX-IX of FIG. 8.

FIG. 8 is a plan view illustrating first and second solar cells included in a solar cell panel according to another embodiment of the present disclosure, and FIG. 9 is a cross-sectional view of a solar cell panel corresponding to line IX-IX of FIG. 8.

Referring to FIGS. 8 and 9, in the present embodiment, the fixing portions for fixing the second extension wiring 26 of the first solar cell 10a and the first extension wiring 24 of the second solar cell 10b may include the fixing member 29 that covers at least a part of the connection portion.

In this case, the fixing member 29 may include various materials capable of fixing the first and second extension wirings 24 and 26 and the first and/or second solar cells 10a and 10b. For example, the fixing member 29 may include a base member 29a and an insulating tape including an adhesive layer 29b positioned on one surface of the base member 29a and connected to the wiring unit 20. As such, when the fixing member 29 is formed of a tape, the fixing member 29 may be fixed at a desired position by a simple process of attaching the tape.

The base member 29a may serve to increase the strength of the fixing member 29. For example, the base member 29a may include a resin as a main component, and may include, for example, polyethylene (PE), polyethylene terephthalate (PET), or the like.

In addition, the adhesive layer 29b may include an adhesive material or a cohesive material and may be fixed to the wiring material 22 by adhesion or cohesion. Here, the adhesion may mean that at least one layer is damaged when two layers are physically perfectly attached and the two layers are separated, and the cohesion may mean that two layers may mean fixed so that the two layers may be attached to or separated from each other without damage by a constant physical force at room temperature. When the adhesive layer 29b includes an adhesive material, the adhesive layer 29b may have better fixing properties. When the adhesive layer 29b contains an adhesive material, the fixing member 29 may be easily separated when the fixing member 29 is incorrectly attached or when the solar cell 10 is replaced or repaired. For example, the adhesive layer 29b may include epoxy-based, acryl-based, or silicone-based adhesive materials or adhesive materials.

In this case, the thickness of the base member 29a may be equal to or greater than the thickness of the adhesion layer 29b. Thereby, the strength of the fixing member 29 may be improved. For example, the thickness of the base member 29a may be 100 μm or less (e.g., 50 μm to 70 μm), and the thickness of the adhesive layer 29b may be 100 μm or less (e.g., 10 μm to 30 μm). However, the present disclosure is not limited thereto, and the thickness of the base member 29a and the thickness of the adhesive layer 29b may have various values.

In addition, the fixing member 29 may not be formed of an insulating tape, but may be formed by applying an adhesive material or an adhesive material.

In the present embodiment, the fixing member 29 may be formed to cover the connection portion CP (in particular, the overlapping portion OP) of the first and second extension wirings 24 and 26 on the rear surface of the first solar cell 10a and/or the second solar cell 10b. For example, the fixing member 29 may adhere to the rear surfaces of the first and second extension wirings 24 and 26 on the rear surface of the first solar cell 10a and/or the second solar cell 10b. Then, the fixing structure may be simplified.

For example, as illustrated in FIG. 8, the fixing member 29 may be formed across the first and second solar cells 10a and 10b while extending long in a direction intersecting (e.g., orthogonal) with the extending direction of the first and second extension wirings 24 and 26. In this case, the first and second extension wirings 24 and 26 may be stably fixed.

Figure 10:
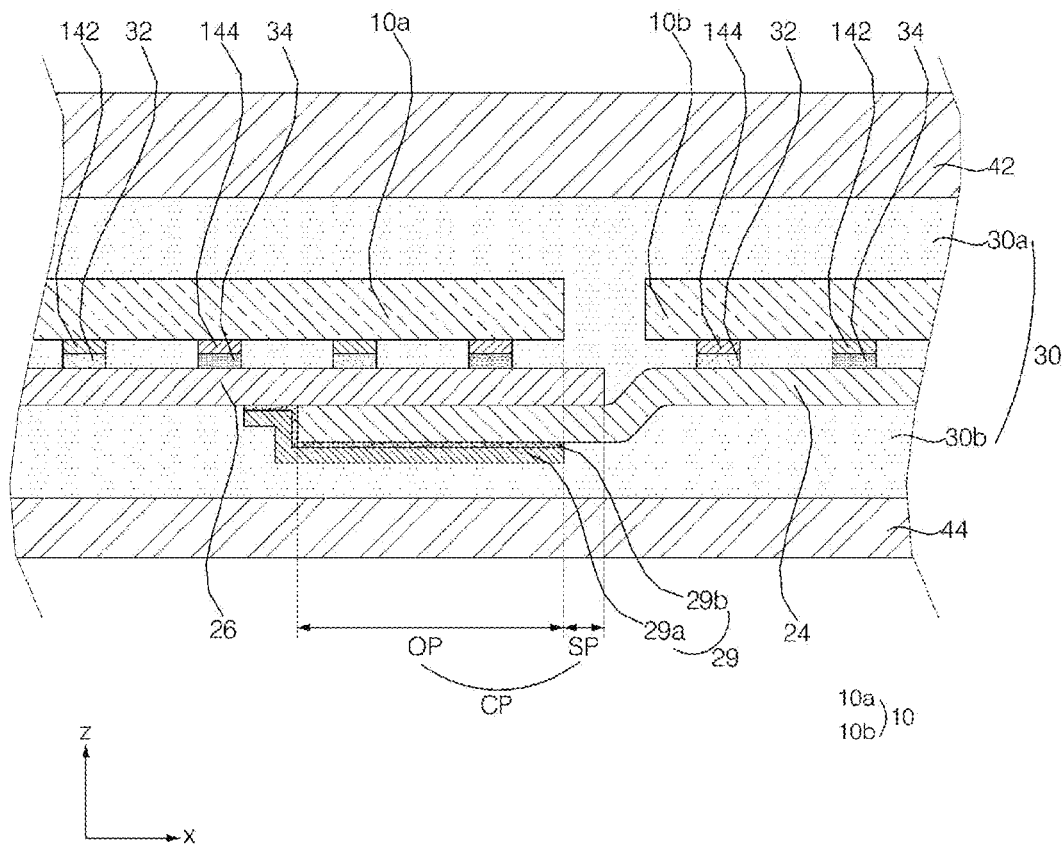
FIG. 10 is a plan view illustrating first and second solar cells included in a solar cell panel according to a modified example of the present disclosure.

However, the present disclosure is not limited thereto. As a modified example, as illustrated in FIG. 10, the fixing member 29 may be provided to correspond to the first solar cell 10a in which the overlapping portion OP of the corresponding first and second extension wirings 24 and 26 is positioned among the first and second solar cells 10a and 10b. In addition, the planar shape of the fixing member 29 can also be variously modified. In addition, FIGS. 8 to 10 illustrate that the fixing member 29 is positioned on the rear surface of the first and second extension wirings 24 and 26, but the present disclosure is not limited thereto. For example, the fixing member 29 may be positioned on the front surface of the first and second extension wirings 24 and 26, or may be positioned both on the front and rear surfaces of the first and second extension wirings 24 and 26. When the fixing member 29 is positioned on the front surface of the first and second extension wirings 24 and 26, the fixing member 29 may have a constant color to contribute to the improvement of the appearance of the solar cell panel 100. For example, the fixing member 29 may be configured as a shield member that has an opaque color or a color similar to that of the solar cell 10 while having a shape corresponding to the inter-cell region between the first and second solar cells 10a and 10b so that the boundary surface of the solar cells 10 is not recognized well. Various other modifications are possible.

Although the above description is based on the first and second solar cells 10a and 10b, the above description may be applied to two solar cells adjacent to each other in the plurality of solar cells 10 including the first and second end solar cells.

In the above-described method for manufacturing the solar cell panel 100 including the first and second solar cells 10a and 10b, the fixing portion forming step ST50 may be performed by attaching the fixing member 29 to the first and/or second solar cells 10a and 10b and on the first and second extension wirings 24 and 26.

Hereinafter, the present disclosure will be described in more detail by way of experimental examples of the present disclosure. However, the experimental examples of the present disclosure are only for illustrating the present disclosure, and the present disclosure is not limited thereto.

EXAMPLE 1

A plurality of solar cells as illustrated in FIG. 2 were manufactured, an insulating member and a connection member were formed in each solar cell, and a preliminary soldering process was performed at a temperature of 300° C. to attach first and second extension members. A solar cell string was formed by connecting the first and second extension wirings of two adjacent solar cells to include a connection portion, and a soldering process was performed at a temperature of 450° C. to attach a bus bar wiring to the solar cell string. Manufacturing of a solar cell panel is completed by sequentially stacking a first cover member, a first encapsulant, a solar cell string to which a bus bar wiring is attached, a second encapsulant, and a second cover member and performing a lamination process in which pressure is applied at a temperature of 180° C.

Here, the first and second extension members were formed by performing a yield strength increasing process of tensioning a base wiring having yield strength of 80 MPa, and thus, the yield strength was 110 MPa. In addition, the first and second extension wirings contained a tin-bismuth alloy and had a melting point of 120° C., and the bus bar wiring contained a tin-lead alloy and had a melting point of 150° C. In addition, the connection portion of the first and second extension wirings were positioned to have an overlapping portion overlapping one solar cell, and a length of the overlapping portion was 3 mm.

COMPARATIVE EXAMPLE 1

Except that the connection portion of the first and second extension wiring does not have an overlapping portion overlapping one solar cell and is positioned only in a spaced region between adjacent solar cells, and the connection portion has a length smaller than the spaced distance, a solar cell panel was manufactured in the same manner as in Example 1.

Figure 11:
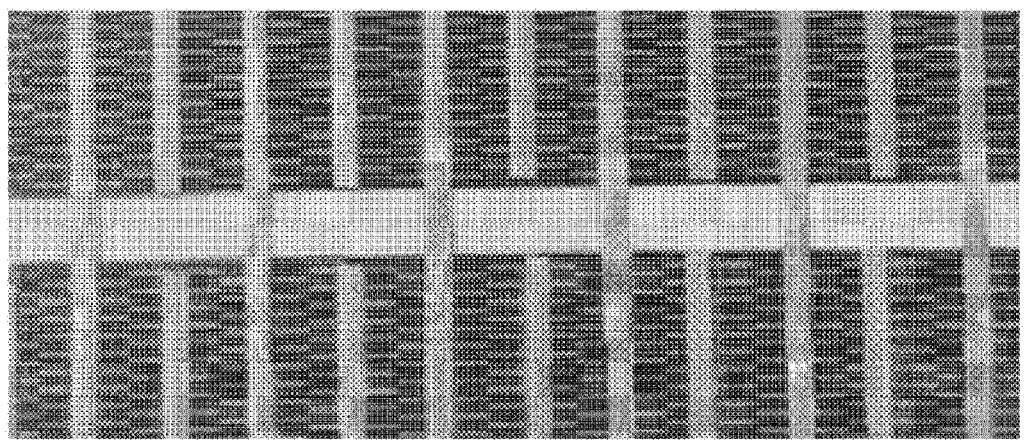
FIG. 11 is a photograph of a portion of the solar cell panel after a thermal cycle (TC) test is repeated on a solar cell panel according to Example 1 200 times.
Figure 12:
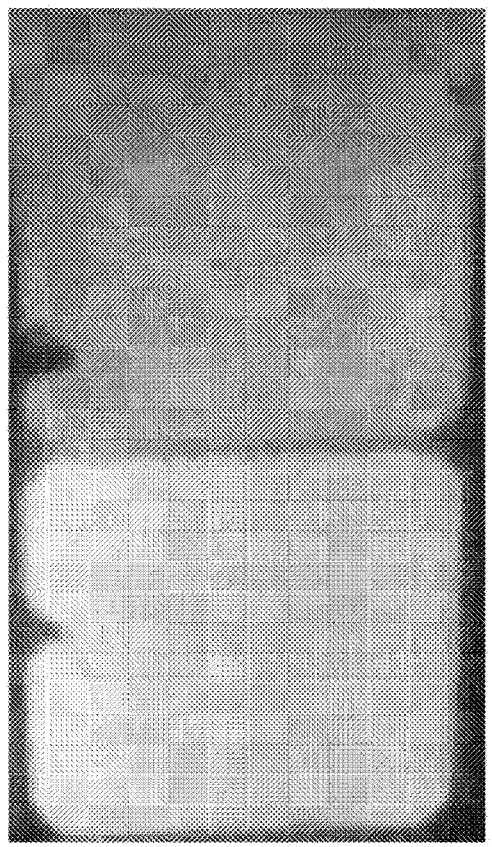
FIG. 12 is an electro luminescence (EL) photograph of a portion of the solar cell panel after the thermal cycle test is repeated on the solar cell panel according to Example 1 200 times.
Figure 13:
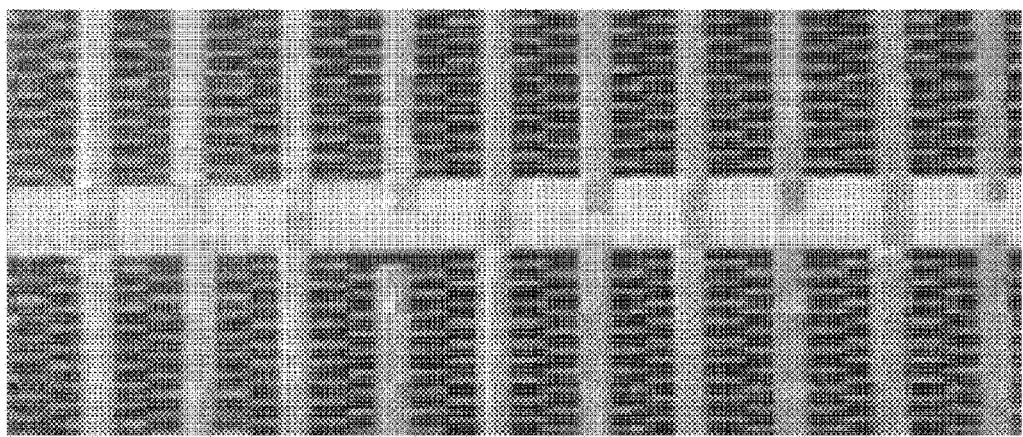
FIG. 13 is a photograph of a portion of the solar cell panel after repeating the thermal cycle test is repeated on the solar cell panel according to Comparative Example 1 200 times.
Figure 14:
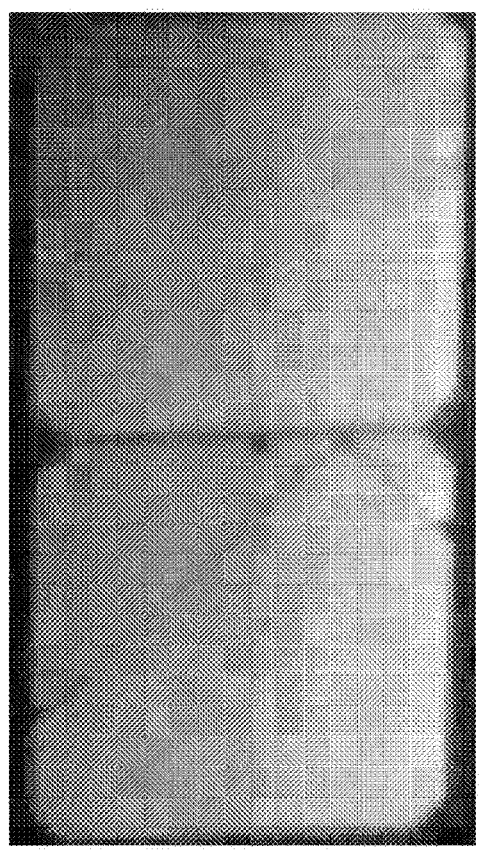
FIG. 14 is an electro luminescence photograph of a portion of the solar cell panel after repeating the thermal cycle test is repeated on the solar cell panel according to Comparative Example 1 200 times.

After repeatedly performing 200 times the thermal cycle (TC) test on the solar cell panel according to Example 1, a photograph and an electro luminescence (EL) photograph of a part of the solar cell panel were illustrated in FIGS. 11 and 12, and after repeatedly performing 200 times the thermal cycle test on the solar cell panel according to Example 1, a photograph and an electro luminescence (EL) photograph of a part of the solar cell panel were each illustrated in FIGS. 13 and 14.

Referring to FIG. 11, it can be seen that, in the solar cell panel according to Example 1, the first and second extension wirings are stably connected. Referring to FIG. 12, it can be seen that, in the solar cell panel according to Example 1, no shading occurred in the solar cell even in the electro luminescence photograph, and therefore, the lifting phenomenon of the first and second extension wirings did not occur even after the thermal cycle test. As described above, in Example 1 including the overlapping portion, it can be seen that the first and second extension wirings are stably connected and the lifting phenomenon of the first and second extension wirings do not occur, and thus, the first and second extension wirings have excellent reliability.

On the other hand, referring to FIG. 13, in the solar cell panel according to Example 1, it can be seen that a portion where the first and second extension wirings are not stably connected has occurred. Referring to FIG. 14, in the solar cell panel according to Comparative Example 1, it can be seen that the shading that looked darker than other portions in the solar cell in the electro luminescence photograph did not occur, and as a result, even after the thermal cycle test, the lifting phenomenon of the first and second extension wirings has occurred. As described above, in Comparative Example 1 not including the overlapping portion, the first and second extension wirings are not stably connected or the lifting phenomenon of the first and second extension wirings has occurred, and thus, the reliability may be reduced.

Features, structures, effects, etc., according to the above description are included in at least one embodiment of the present disclosure, and are not necessarily limited only to one embodiment. Furthermore, features, structures, effects, etc., illustrated in each embodiment can be practiced by being combined or modified for other embodiments by those of ordinary skill in the art to which the embodiments pertain. Accordingly, the contents related to such combinations and modifications should be interpreted as being included in the scope of the present disclosure.

The invention claimed is:

1. A solar cell panel, comprising:
a plurality of solar cells including first and second solar cells electrically connected to each other;
wherein each solar cell comprises: first electrodes and second electrodes positioned on a rear surface of the solar cell; a first extension wiring electrically connected to the first electrodes and insulated from the second electrodes; and a second extension wiring electrically connected to the second electrodes and insulated from the first electrodes,
the first extension wiring has a first outer portion extending outwards beyond a first side of the solar cell in a first direction, and the second extension wiring has a second outer portion extending outwards beyond a second side of the solar cell in the first direction, the second side being opposite to the first side of the solar cell in the first direction,
the second extension wiring of the first solar cell and the first extension wiring of the second solar cell overlap each other to have a connection portion where the second extension wiring and the first extension wiring are connected to each other, the connection portion includes an overlapping portion formed by the connection portion overlapping a portion of the first solar cell, and the solar cell panel further comprises a fixing member that covers a portion of the first solar cell and at least a portion of the connection portion, and the fixing member comprises a base member and an insulating adhesive layer positioned on one surface of the base member.

2. The solar cell panel of claim 1, wherein the second extension wiring of the first solar cell and the first extension wiring of the second solar cell extend in parallel to each other and are directly connected to each other.

3. The solar cell panel of claim 1, wherein the second extension wiring of the first solar cell is positioned to be spaced apart from the second solar cell.

4. The solar cell panel of claim 1, wherein the first extension wiring of the second solar cell is positioned on the second extension wiring of the first solar cell in the connection portion.

5. The solar cell panel of claim 1, wherein a length of the first outer portion is greater than a width of the first or second extension wiring; or
a length of the second outer portion is greater than the width of the first or second extension wiring; or
a length of the connection portion is greater than the width of the first or second extension wiring; or
a length of the second outer portion is equal to or greater than a separation distance between an outer end portion of the second outer portion and the second solar cell; or
a length of the overlapping portion is greater than the width of the first or second extension wiring; or
the length of the overlapping portion is longer than that of the second outer portion; or
the length of the overlapping portion is equal to or greater than an end distance between an inner end portion of the first or second extension wiring and the second side or the first side of the solar cell.

6. The solar cell panel of claim 1, wherein the overlapping portion is positioned to overlap at least one of the first and second electrodes provided in the first solar cell.

7. The solar cell panel of claim 1, wherein the connection portion includes an inter-cell portion positioned in an inter-cell region between the first solar cell and the second solar cell.

8. The solar cell panel of claim 1, wherein an area of the connection portion is 3 to 16.5 mm$^2$.

9. The solar cell panel of claim 1, wherein yield strength of the first extension wiring or the second extension wiring is 80 to 170 MPa.

10. The solar cell panel of claim 1, wherein the plurality of solar cells constitute a plurality of solar cell strings in a second direction intersecting the first direction, and further includes a bus bar wiring connecting the plurality of solar cell strings in the second direction, and
the first extension wiring or the second extension wiring has a different material, a different melting point, or different yield strength from the bus bar wiring.

11. The solar cell panel of claim 10, wherein a melting point of the first extension wiring or the second extension wiring is higher than that of the bus bar wiring;

the first extension wiring or the second extension wiring contains a tin-bismuth alloy and the bus ribbon contains a tin-lead alloy; or
yield strength of the first extension wiring or the second extension wiring is lower than that of the bus bar wiring.

12. The solar cell panel of claim 1, wherein each solar cell further comprises a semiconductor substrate including a base region and a front electric field region, an intermediate layer positioned on a rear surface of the semiconductor substrate, first conductive regions, second conductive regions, barrier regions, and a rear passivation layer,
wherein the first conductive regions, the second conductive regions, and the barrier regions are provided between the intermediate layer and the rear passivation layer, the first conductive regions are alternately arranged with the second conductive regions, adjacent first and second conductive regions are spaced apart by the barrier region, and
wherein, in a plan view, the fixing member overlaps both the semiconductor substrate of the first solar cell and the semiconductor substrate of the second solar cell.

13. The solar cell panel of claim 12, wherein, in the plan view, an overlapping region between the fixing member and the semiconductor substrate of the first solar cell is greater than an overlapping between the fixing member and the semiconductor substrate of the second solar cell.

14. The solar cell panel of claim 1, wherein, in a plan view, the fixing member overlaps the overlapping portion and does not overlap an inter-cell region between the first solar cell and the second solar cell.

15. A solar cell panel, comprising:
a solar cell;
first electrodes and second electrodes on a rear surface of the solar cell;
a first extension wiring electrically connected to the first electrodes, insulated from the second electrodes, and including a first outer portion extending outwards beyond a first side of the solar cell in a first direction; and
a second extension wiring electrically connected to the second electrodes, insulated from the first electrodes, and having a second outer portion extending outwards beyond a second side opposite to the first side of the solar cell in the first direction,
wherein the first outer portion has a bending portion, and a length of the first outer portion is greater than a length of the second outer portion.

16. The solar cell panel of claim 15, wherein the length of the first outer portion is greater than a width of the first or second extension wiring;
the length of the second outer portion is greater than the width of the first or second extension wiring;
the length of the second outer portion is equal to or greater than an end distance between an inner end portion of the first or second extension wiring and the second side or the first side of the solar cell; or
an inner end portion of the first extension wiring and an inner end portion of the second extension wiring are symmetrically positioned to each other in the first direction.

* * * * *